US011923194B2

(12) United States Patent
Chiang et al.

(10) Patent No.: US 11,923,194 B2
(45) Date of Patent: Mar. 5, 2024

(54) EPITAXIAL BLOCKING LAYER FOR MULTI-GATE DEVICES AND FABRICATION METHODS THEREOF

(71) Applicant: Taiwan Semiconductor Manufacturing Co., Ltd., Hsin-Chu (TW)

(72) Inventors: Hsin-Che Chiang, Taipei (TW); Wei-Chih Kao, Taipei (TW); Chun-Sheng Liang, Changhua County (TW); Kuo-Hua Pan, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 17/728,369

(22) Filed: Apr. 25, 2022

(65) Prior Publication Data

US 2022/0254623 A1 Aug. 11, 2022

Related U.S. Application Data

(62) Division of application No. 16/573,656, filed on Sep. 17, 2019, now Pat. No. 11,315,785.

(51) Int. Cl.
*H01L 21/02* (2006.01)
*H01L 29/66* (2006.01)
(Continued)

(52) U.S. Cl.
CPC .... *H01L 21/0245* (2013.01); *H01L 21/02507* (2013.01); *H01L 21/02587* (2013.01);
(Continued)

(58) Field of Classification Search
CPC .......... H01L 21/0245; H01L 21/02507; H01L 21/02587; H01L 29/0847; H01L 29/66795; H01L 29/785; H01L 21/3065; H01L 29/42392; H01L 29/78696; H01L 21/02447; H01L 21/02502; H01L 21/02532; H01L 21/0262; H01L 21/823807; H01L 21/823821; H01L 21/823878; H01L 27/0924; H01L 27/0928; H01L 21/02603; H01L 29/0673; H01L 29/66787; H01L 29/0665; H01L 29/0669;
(Continued)

(56) References Cited

U.S. PATENT DOCUMENTS 8,772,109 B2  7/2014  Colinge
8,785,285 B2  7/2014  Tsai et al.
(Continued)

*Primary Examiner* — Mohammad A Rahman
(74) *Attorney, Agent, or Firm* — HAYNES AND BOONE, LLP

(57) ABSTRACT

A semiconductor device includes a semiconductor substrate having a first lattice constant, a dopant blocking layer disposed over the semiconductor substrate, the dopant blocking layer having a second lattice constant different from the first lattice constant, and a buffer layer disposed over the dopant blocking layer, the buffer layer having a third lattice constant different from the second lattice constant. The semiconductor device also includes a plurality of channel members suspended over the buffer layer, an epitaxial feature abutting the channel members, and a gate structure wrapping each of the channel members.

20 Claims, 22 Drawing Sheets

(51) Int. Cl.
 *H01L 29/08* (2006.01)
 *H01L 29/78* (2006.01)

(52) U.S. Cl.
 CPC .... *H01L 29/0847* (2013.01); *H01L 29/66795* (2013.01); *H01L 29/785* (2013.01)

(58) Field of Classification Search
 CPC ..... H01L 31/035209; H01L 31/035218; H01L 31/035227; H01L 31/035236; H01L 29/125; H01L 29/127; H01L 29/66977; H01L 33/06; H01L 51/502; H01L 33/504; H01L 2933/0041; H01L 2933/005; H01L 2933/0025; B82Y 10/00
 See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,613,957 B1 | 4/2017 | Oh | |
| 10,263,100 B1 | 4/2019 | Bi et al. | |
| 2006/0144274 A1* | 7/2006 | Kolesnychenko | B82Y 40/00 101/483 |
| 2010/0025696 A1 | 2/2010 | Abbondanza et al. | |
| 2010/0276732 A1 | 11/2010 | Ando et al. | |
| 2012/0012778 A1 | 1/2012 | Tilley et al. | |
| 2013/0037808 A1* | 2/2013 | Kishida | H01L 29/66765 257/E29.273 |
| 2013/0334571 A1* | 12/2013 | Reznicek | H01L 29/1054 257/E29.104 |
| 2014/0374797 A1* | 12/2014 | Kwon | H01L 29/6681 257/190 |
| 2015/0372058 A1* | 12/2015 | Park | H01L 21/02595 438/238 |
| 2015/0372097 A1 | 12/2015 | Bao et al. | |
| 2016/0190249 A1 | 6/2016 | Hsieh et al. | |
| 2017/0373064 A1* | 12/2017 | Chang | H01L 21/823821 |
| 2018/0006139 A1 | 1/2018 | Seo et al. | |
| 2018/0269389 A1* | 9/2018 | Hsu | H01L 45/1253 |
| 2019/0181140 A1* | 6/2019 | Rodder | H01L 29/78696 |
| 2020/0044046 A1 | 2/2020 | Zhou | |
| 2020/0105872 A1* | 4/2020 | Glass | H01L 29/78618 |
| 2020/0312981 A1* | 10/2020 | Bomberger | H01L 29/7848 |
| 2020/0407213 A1 | 12/2020 | Kub et al. | |
| 2020/0411698 A1* | 12/2020 | Kim | H01L 29/66439 |

\* cited by examiner

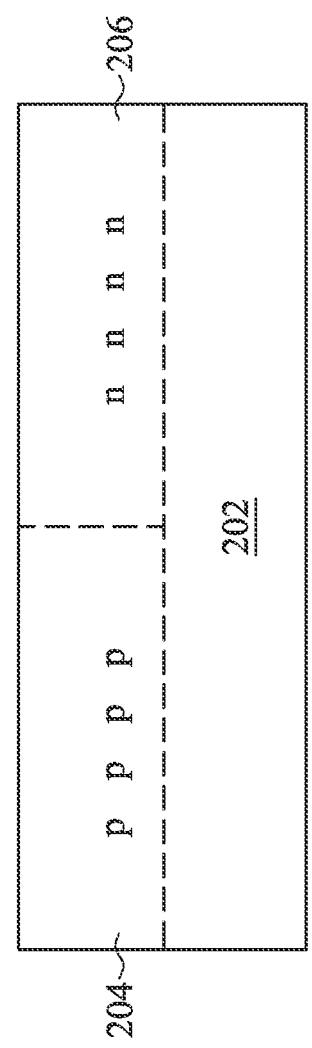
FIG. 2

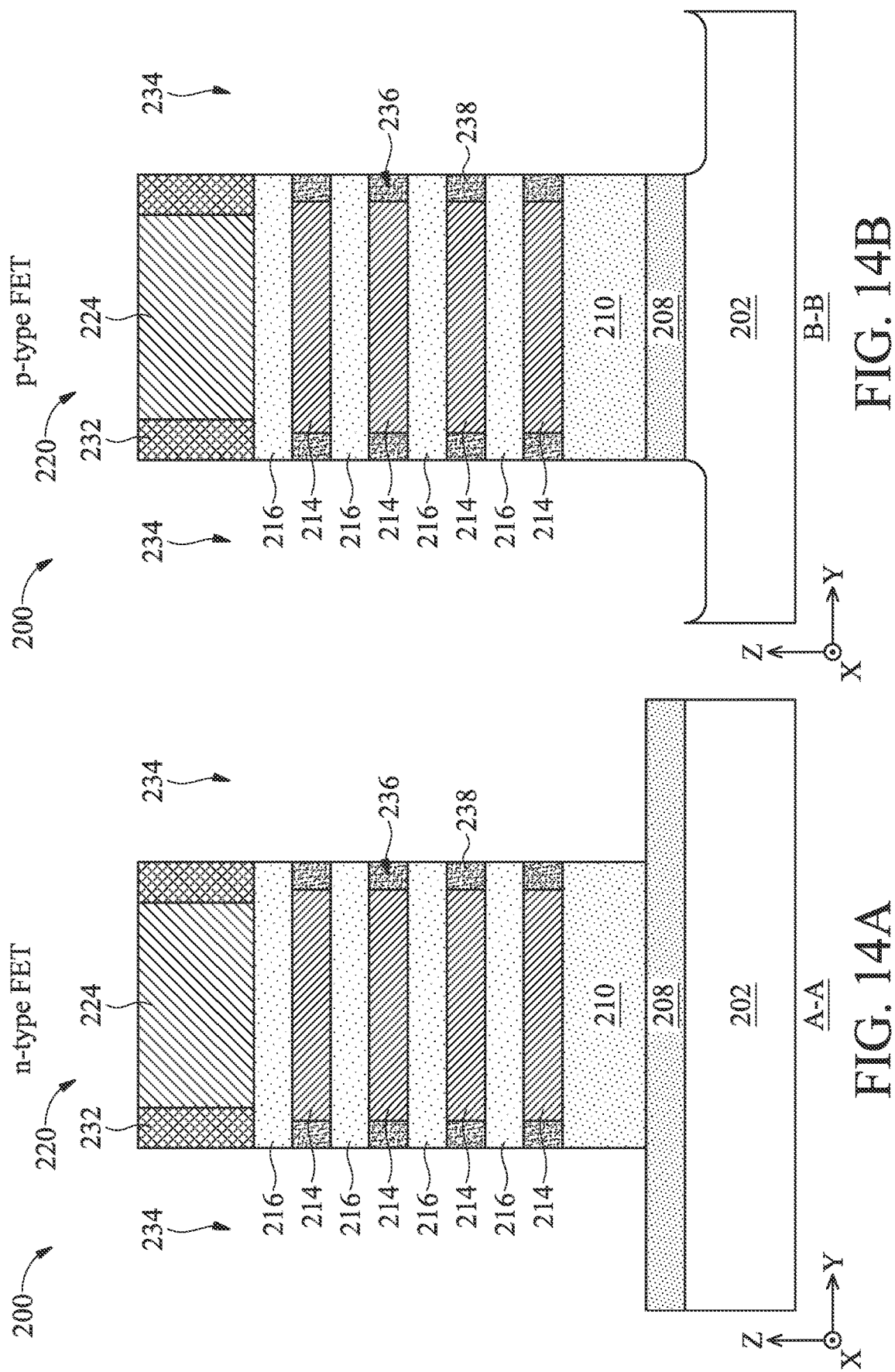

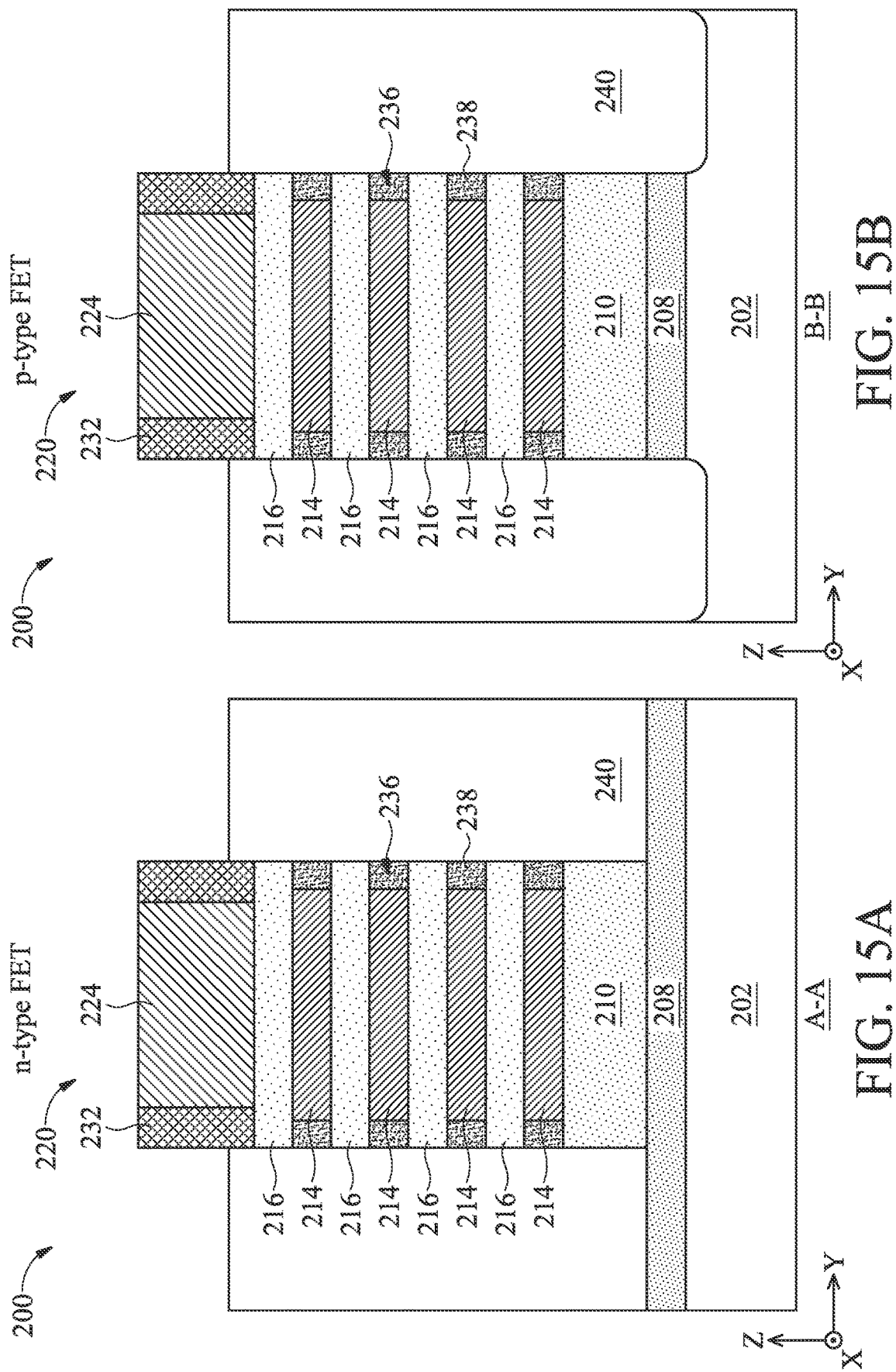

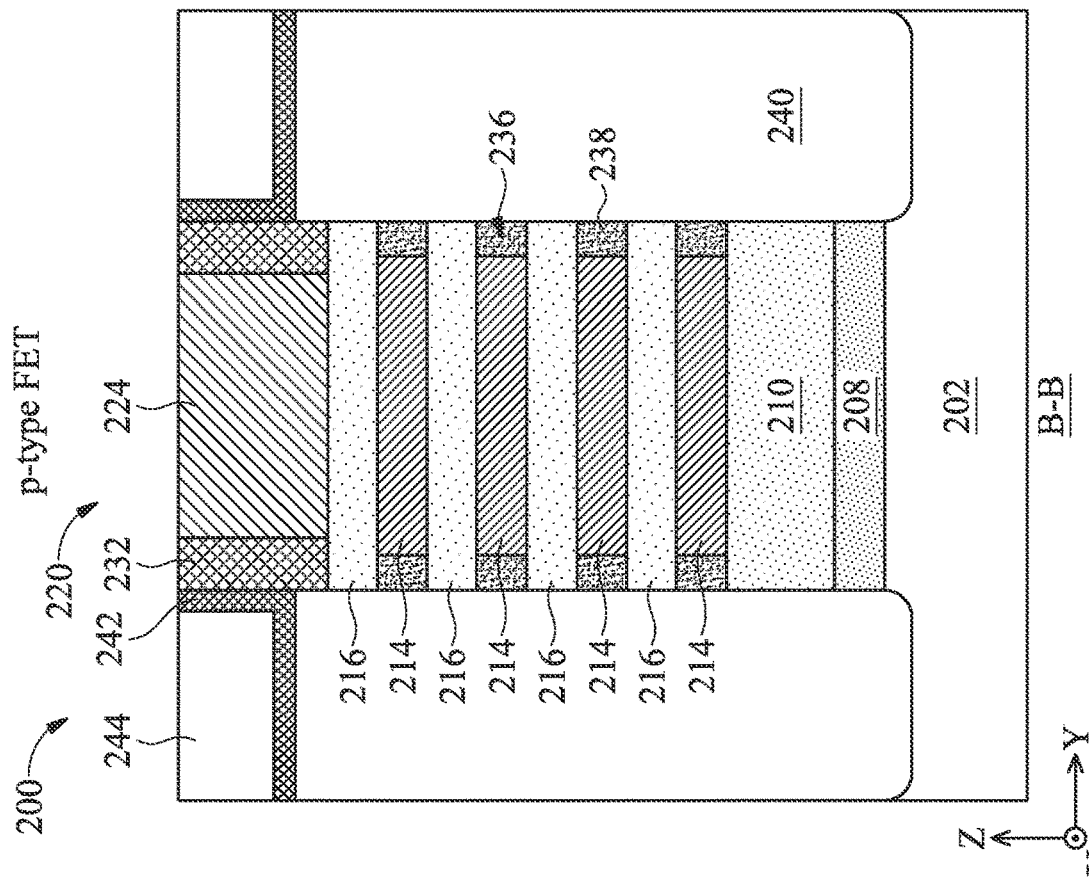
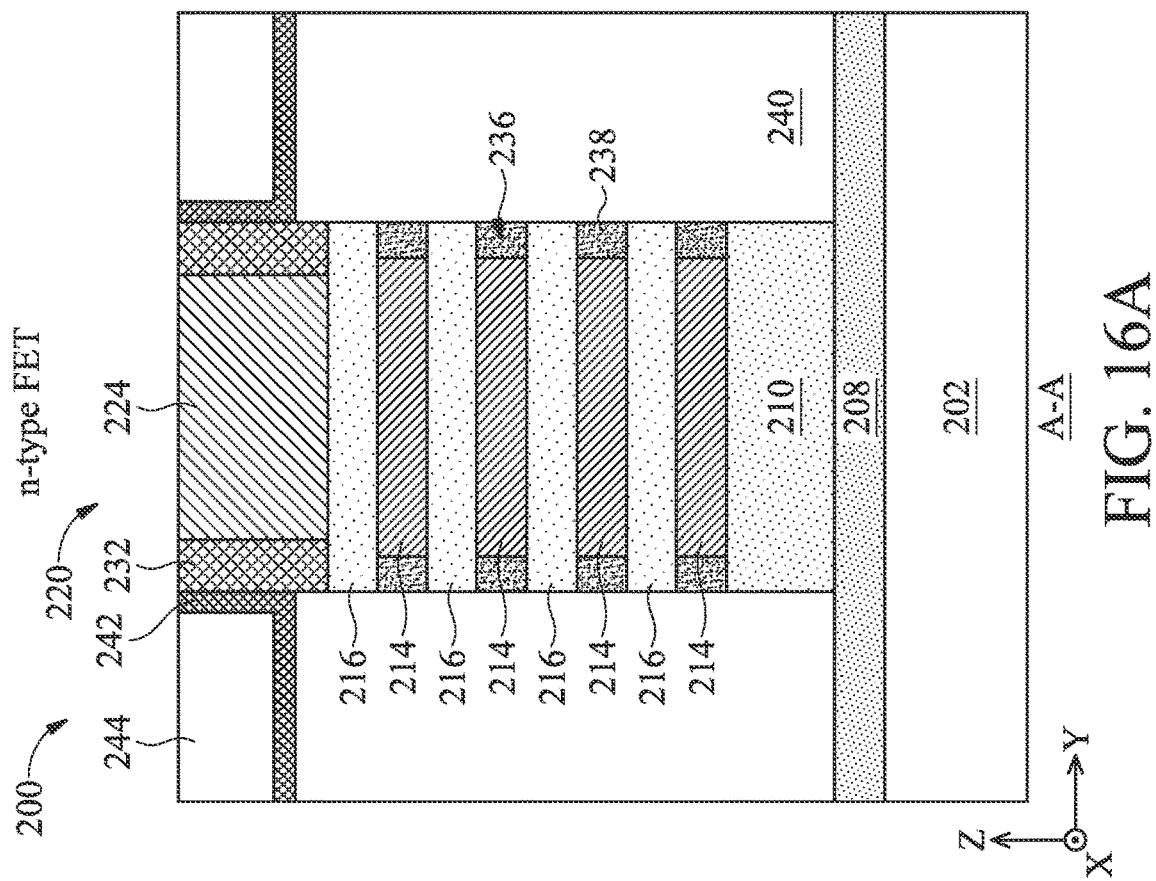
FIG. 16A
FIG. 16B

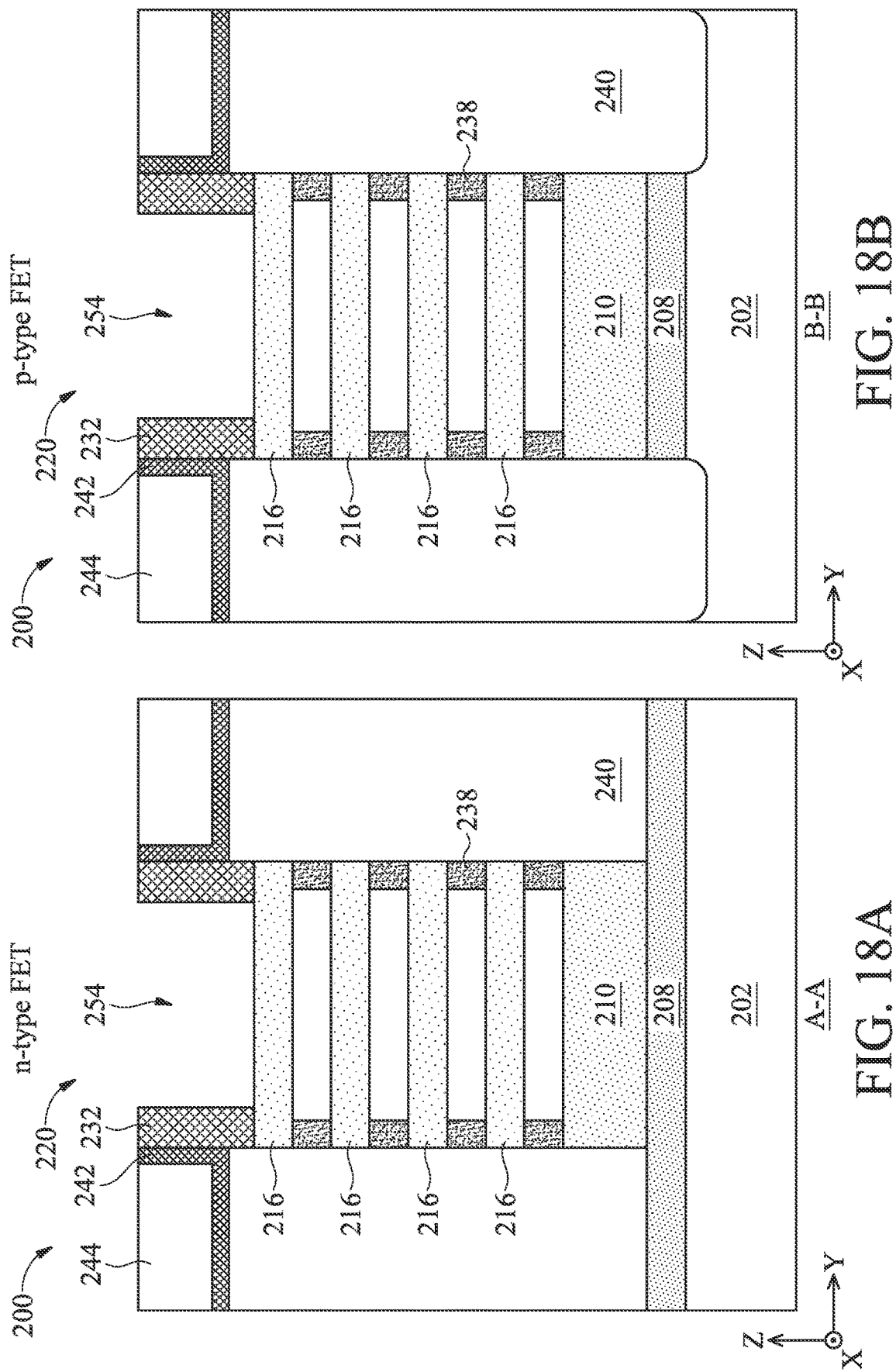

EPITAXIAL BLOCKING LAYER FOR MULTI-GATE DEVICES AND FABRICATION METHODS THEREOF

PRIORITY DATA

This is a divisional application of U.S. patent application Ser. No. 16/573,656, filed on Sep. 17, 2019, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the gate-all-around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a stacked nanosheet configuration. Integration of fabricating the GAA features around stacked nanosheets can be challenging. For example, conventionally in a GAA process flow an anti-punch-through (APT) implantation is performed in the substrate beforehand the formation of an epitaxial stack. However, unwanted diffusion of the impurity dopants from the APT layer during the epitaxial growing of semiconductor fins may cause lattice dislocation. Furthermore, in a GAA process flow, inner-spacer formation can be an important process to reduce capacitance and prevent leakage between gate stacks and source/drain (S/D) regions. However, uneven diffusion of the impurity dopants from the APT layer may cause inner-spacer misalignment, which in turn introduces non-uniformity to GAA devices and may degrade integrated chip performance. Therefore, while the current methods have been satisfactory in many respects, challenges with respect to performance of the resulting device may not be satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2, 3, 4, 5, 6, 7 are fragmentary cross-sectional views of an example semiconductor device in accordance with some embodiments of the present disclosure.

FIGS. 9, 10, 11, 12, 13, 14A, 15A, 16A, 17A, 18A, and 19A are corresponding fragmentary cross-sectional views of a semiconductor device in FIG. 8 taken along a first cut A-A at intermediate stages of an embodiment of the method of FIGS. 1A and 1B in accordance with some embodiments of the present disclosure.

FIGS. 14B, 15B, 16B, 17B, 18B, and 19B are corresponding fragmentary cross-sectional views of a semiconductor device in FIG. 8 taken along a second cut B-B at intermediate stages of an embodiment of the method of FIGS. 1A and 1B in accordance with some embodiments of the present disclosure.

DETAILED DESCRIPTION

Figure 1A:
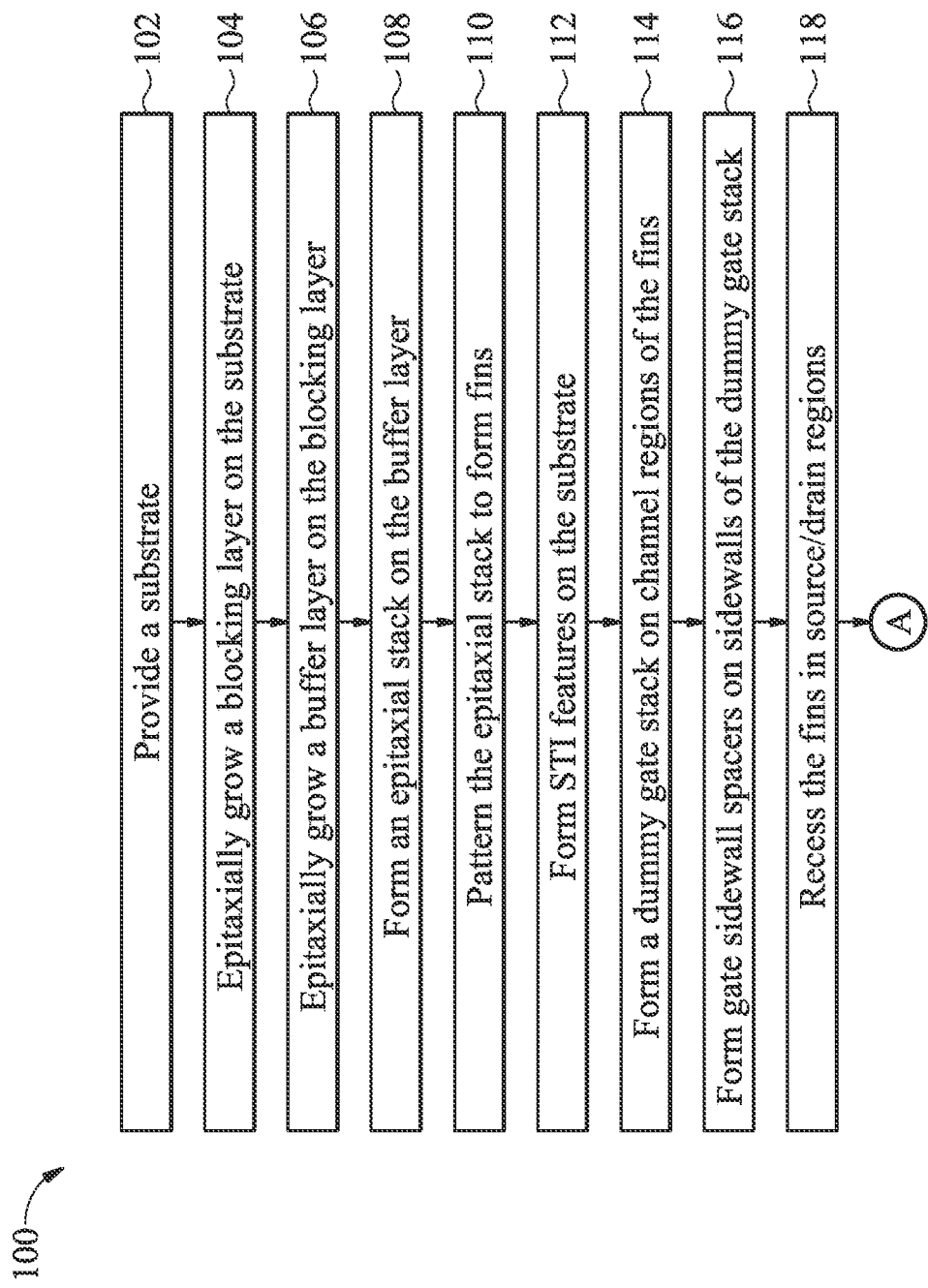
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheets) or any number of channels. One of ordinary skill may recognize other examples of semiconductor devices that may benefit from aspects of the present disclosure.

Conventionally in a GAA process flow, before forming an epitaxial stack, the semiconductor substrate (or substrate) may be lightly doped with p-type and n-type impurities to form well regions. An anti-punch-through (APT) implantation is then performed on a top portion of substrate to form an APT region in order to reduce leakage between the to-be-formed GAA device and the substrate. The doping concentration in the APT region may be in the range between about $1\times10^{18}/cm^3$ and about $1\times10^{19}/cm^3$. The APT region extends under the epitaxial stack from which stacked nanosheets are to be formed subsequently. However, dopants in the APT region may diffuse into the epitaxial stack causing lattice dislocation. Furthermore, dopant diffusion from the APT region into the epitaxial stack may cause inner spacer misalignment and thus channel width variations. A GAA device includes inner spacers and gate sidewall spacers, among others. Inner spacers provide isolation between gate structure and S/D features and are typically formed by an additional process to the gate sidewall spacers. For example, after making gate sidewall spacers and epitaxially growing S/D features, cavities for forming inner spacers are made by wet or vapor etch removal. Then, inner spacers are formed by dielectric material deposition. However, a fine control of the dimensions of the cavities may be challenging during a wet or vapor etch removal, such as due to uneven dopant diffusion from the APT region, where lower portions of the epitaxial stack often has a higher dopant diffusion than upper portions which causes higher etch rate and larger cavities in lower portions of the epitaxial stack. Consequently, the resulting inner spacer may have non-uniform dimensions across different layers of the nanosheets, further causing channel length variation. An object of the present disclosure is to devise an undoped blocking layer to replace the APT region so as to epitaxially grow high quality epitaxial stack and to accurately control dimensions of inner spacers and to improved channel length uniformity across different layers of the nanosheets.

Figure 1B:
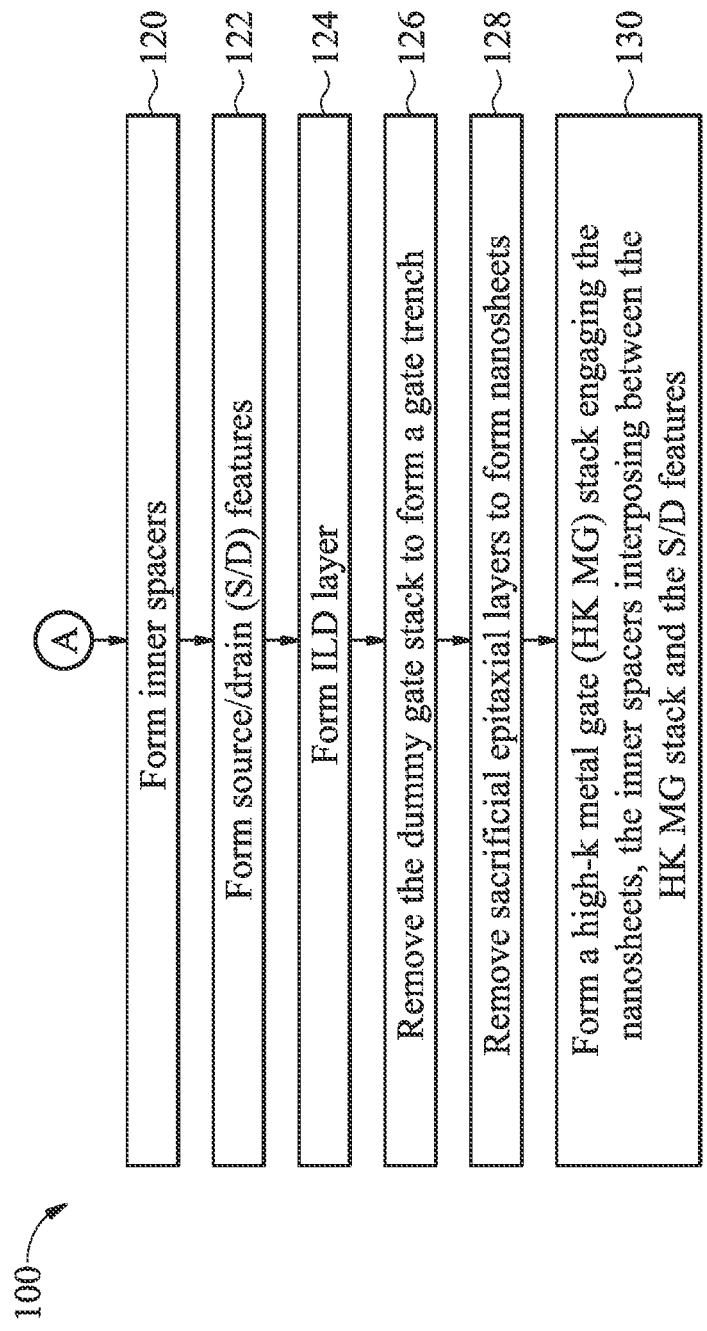

FIGS. 1A and 1B illustrate a flow chart of a method 100 for forming multi-gate devices according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "nanosheet" or "semiconductor nanosheet," which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

Figure 20:
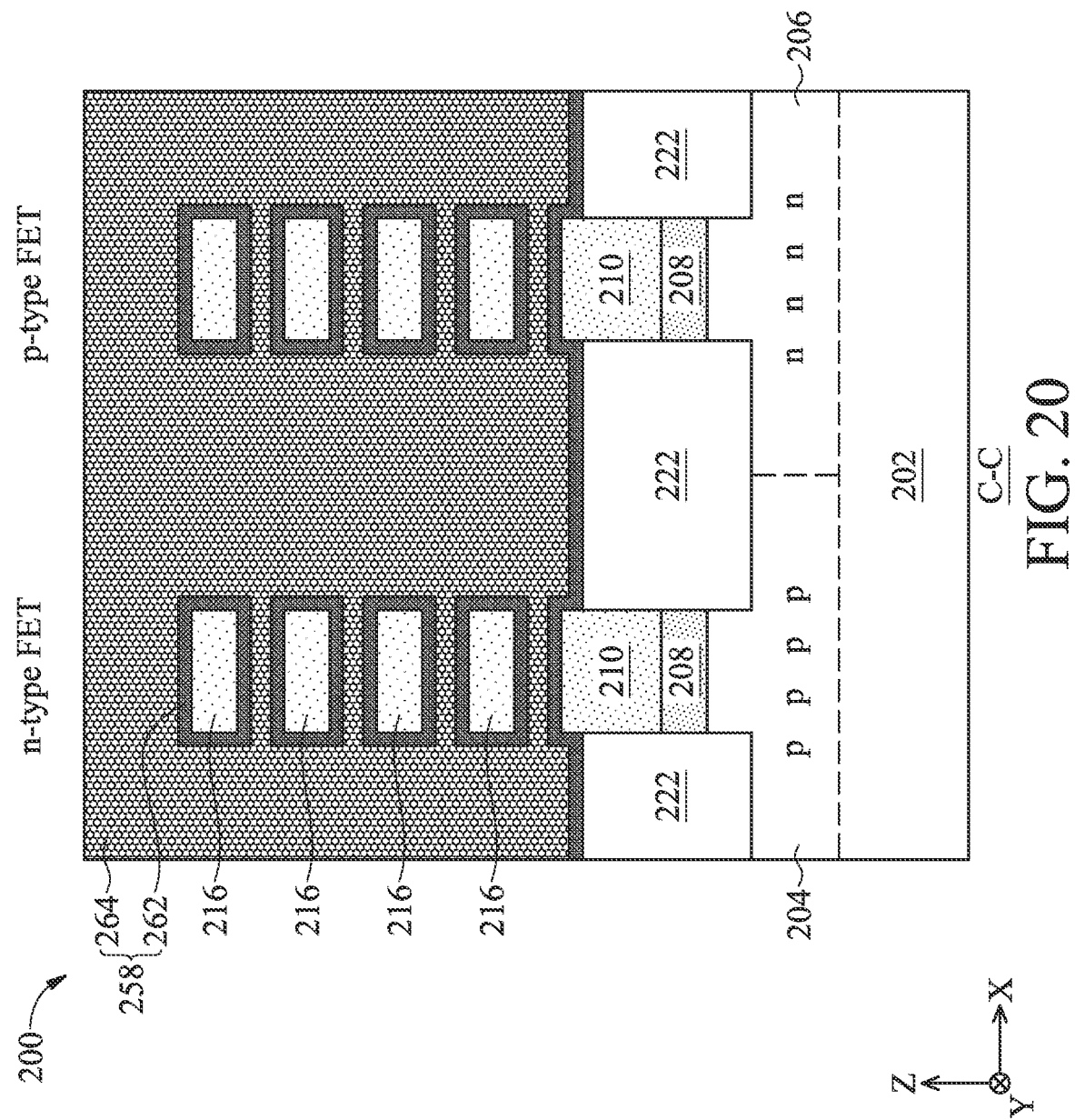
FIGS. 20 and 21 are corresponding fragmentary cross-sectional views of a semiconductor device in FIG. 8 taken along a third cut C-C at intermediate stages of an embodiment of the method of FIGS. 1A and 1B in accordance with some embodiments of the present disclosure.
Figure 21:
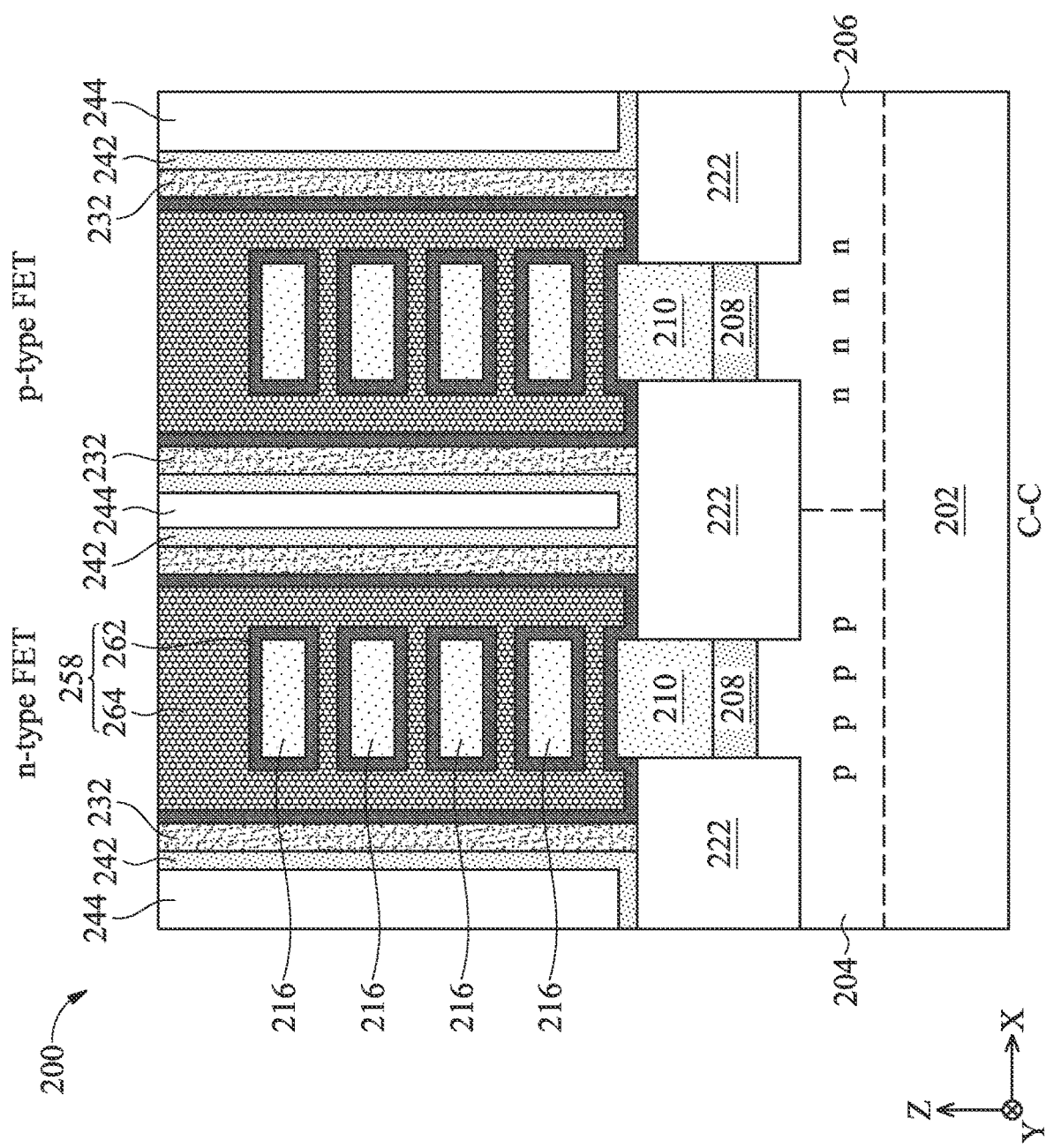

FIGS. 1A and 1B will be described below in conjunction with FIGS. 2-21. FIGS. 2-7 are fragmentary cross-sectional views of a semiconductor device 200 at various stages of fabrication according to method 100. FIG. 8 is a diagrammatic perspective view of a semiconductor device 200 at an intermediate stage of fabrication according to method 100. FIGS. 9-13, 14A, 15A, 16A, 17A, 18A, and 19A are fragmentary cross-sectional views of an n-type FET (along the A-A line) of the semiconductor device 200 in FIG. 8 at various other stages of fabrication according to method 100. FIGS. 14B, 15B, 16B, 17B, 18B, and 19B are fragmentary cross-sectional views of a p-type FET (along the B-B line) of the semiconductor device 200 in FIG. 8 at various other stages of fabrication according to method 100. FIGS. 20 and 21 are fragmentary cross-sectional views of an n-type FET and a p-type FET (along the C-C line) of the semiconductor device 200 in FIG. 8 at various other stages of fabrication according to method 100. The method 100 is merely an example, and is not intended to limit the present disclosure beyond what is explicitly recited in the claims. Additional steps can be provided before, during, and after method 100, and some of the steps described can be moved, replaced, or eliminated for additional embodiments of method 100. Additional features can be added in the semiconductor device depicted in FIGS. 2-21 and some of the features described below can be replaced, modified, or eliminated in other embodiments of the semiconductor device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-21, as with the remainder of the method and exemplary figures provided in this disclosure, are merely exemplary and are not intended to be limiting beyond what is specifically recited in the claims that follow.

At operation 102, the method 100 (FIG. 1A) provides a substrate 202, as shown in FIG. 2. In some embodiments, the substrate 202 may be a semiconductor substrate such as a silicon (Si) substrate. The substrate 202 may include various layers, including conductive or insulating layers formed on a semiconductor substrate. The substrate 202 may include various doping configurations depending on design requirements as is known in the art. For example, different doping profiles (e.g., p-well 204, n-well 206) may be formed on the substrate 202 in regions designed for different device types (e.g., n-type field effect transistors (NFET), p-type field effect transistors (PFET)). The suitable doping may include ion implantation of dopants and/or diffusion processes, such as boron (B) for the p-well 204 and phosphorous (P) for the n-well 206. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. In the illustrated embodiment, the substrate 202 is made of crystalline Si.

Figure 3:
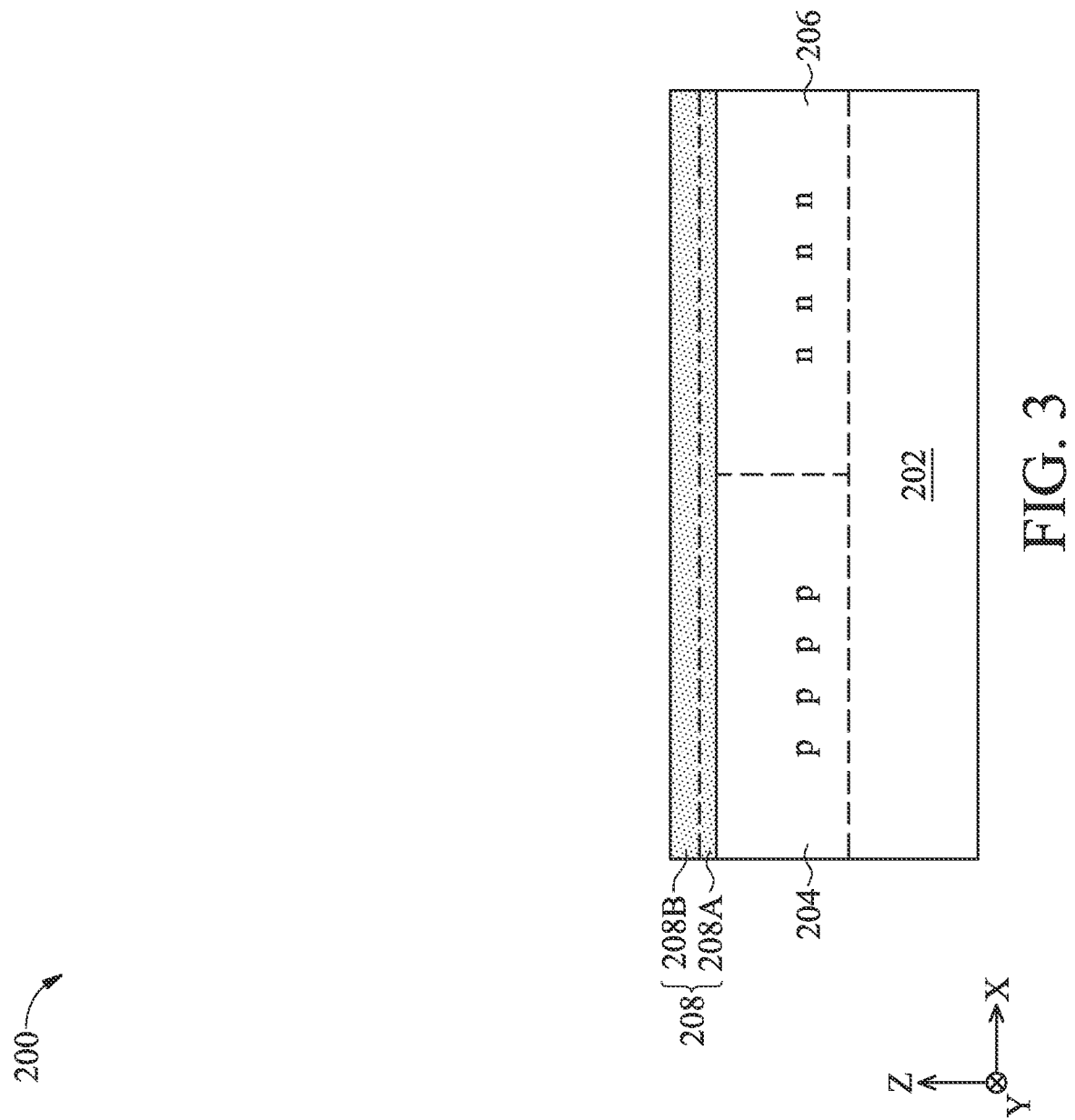
Figure 4:
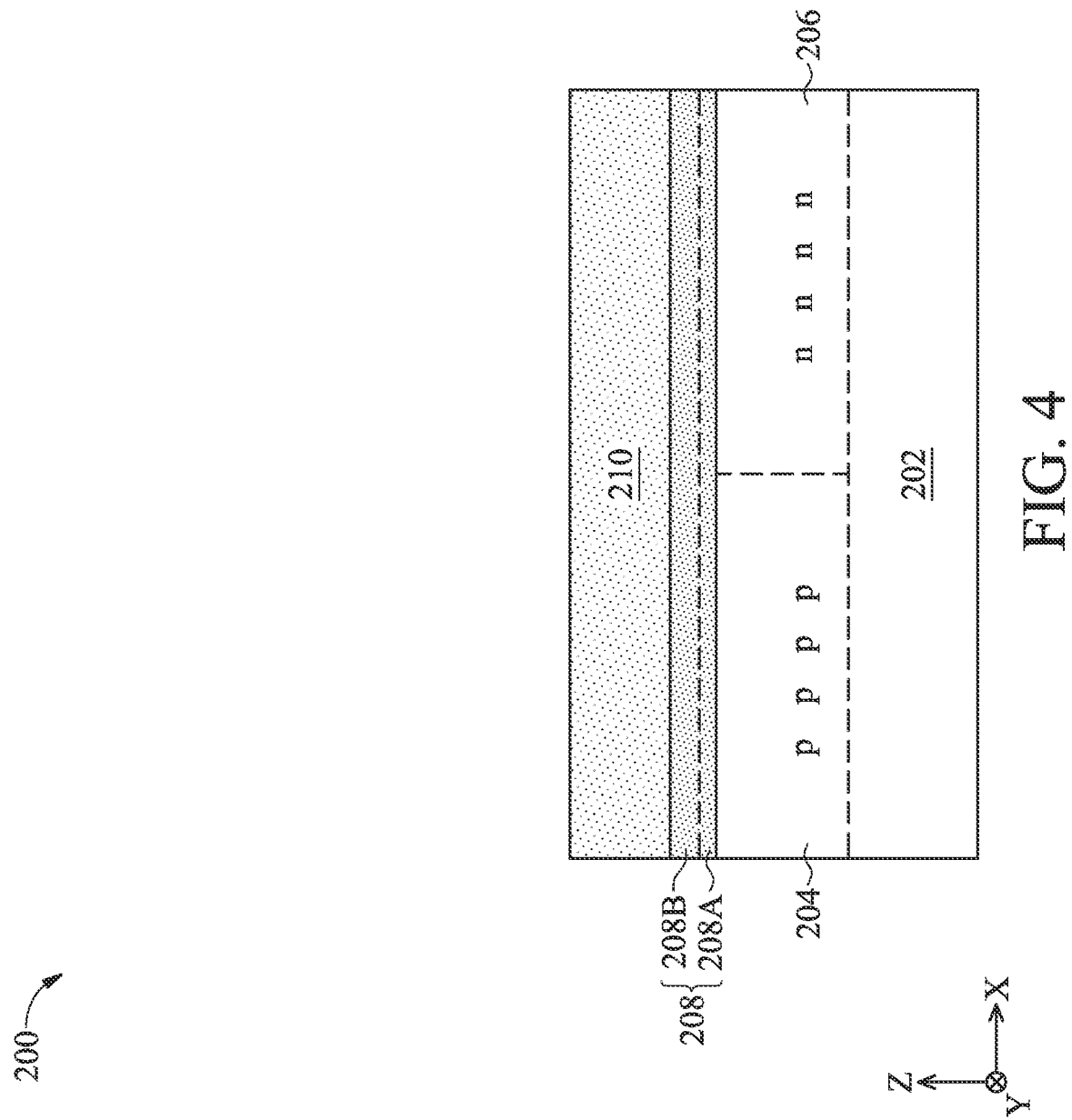

At operation 104, the method 100 (FIG. 1A) epitaxially grows a blocking layer 208 from a top surface of the substrate 202, as shown in FIG. 3. The blocking layer 208 has a higher resistance than the substrate 202 and the epitaxial stack to be formed thereon. With a higher resistance, the blocking layer 208 serves a function of blocking dopants in the substrate 202 (e.g., phosphorous in the n-well and boron in the p-well) to travel upwardly and another function of blocking carriers from the to-be-formed transistors to punch through into the substrate 202. In some embodiments, the blocking layer 208 also has a higher thermal conductivity and a lower coefficient of thermal expansion than the substrate 202 and the to-be-formed buffer layer thereon, which dissipates heat generated from device operations more efficiently and is suitable for high-power and high-temperature applications. The blocking layer 208 may include SiP, SiAs, SiCP, SiC, and/or combinations thereof. In the illustrated embodiment, the blocking layer 208 includes SiC. In some embodiments, the blocking layer 208 has a thickness ranging from about 2 nm to about 5 nm. If the thickness is less than 2 nm, the blocking layer 208 may be too thin to stop the dopant diffusion. If the thickness is larger than 5 nm, the difference of coefficient of thermal expansion among stacked layers may lead to cracks under expansion forces.

In some embodiments, epitaxial growth of the blocking layer 208 (e.g., SiC layer) includes three phases. The first phase is "cleaning", where hydrogen ($H_2$) is used as an etchant to react with and remove impurities on the top surface of the substrate 202, under a first temperature between about 900° C. and about 1000° C. The second phase is "carbonization", where ethylene ($C_2H_4$) is added with the hydrogen as a gas carrier, under a second temperature higher than the first temperature, such as between about 1100° C. and about 1200° C. Ethylene acts as a carbon precursor to catalyze the top surface of the substrate 202 with a high concentration of carbon. The third phase is "growth", where a flow rate of hydrogen is reduced or shut off and a flow of trichlorosilane ($SiHCl_3$, or TCS) is added to the ethylene, under a third temperature higher than the second temperature, such as between about 1250° C. and about 1390° C. The trichlorosilane acts as a silicon precursor to react with the carbon on the surface of the substrate 202 to epitaxially grow the blocking layer 208.

The blocking layer 208 may include two portions, a lower portion 208A which is a polycrystalline layer and an upper portion 208B which is a crystalline layer. The polycrystalline layer may be due to exposing the top surface of the substrate 202 to a high amount of carbon during the carbonization phase, such that an unbalanced C/Si ratio introduces the formation of polycrystal. The C/Si ratio in the lower portion 208A decreases with height. For example, at an interface between the lower portion 208A and the substrate 202, a C/Si ratio may be about 1.2:1. The C/Si ratio monotonously decreases to between about 1:1 and about 1.1:1 at an interface between the lower portion 208A and the upper portion 208B.

At operation 106, the method 100 (FIG. 1A) epitaxially grows a buffer layer 210 on the blocking layer 208. Due to the different material compositions between the blocking layer 208 and the substrate 202, the lattice constants may be different. In some examples, the lattice contact of the blocking layer 208 (e.g., SiP or SiAs layer) may be larger than the substrate 202 (e.g., Si). In some other examples, the lattice contact of the blocking layer 208 (e.g., SiC layer) may be smaller than the substrate 202 (e.g., Si). Accordingly, directly growing an epitaxial stack from the top surface of the blocking layer 208 may cause lattice dislocation due to lattice mismatch. The buffer layer 210 may has a lattice constant between that of the blocking layer and that of the epitaxial stack (at least a bottom portion of the epitaxial stack), such that it serves a transition of the lattice constants. In the illustrated embodiment, the blocking layer 208 is a SiC layer and the buffer layer 210 is an undoped silicon layer that has a larger lattice constant than the blocking layer 208. In some embodiments, the buffer layer 210 has a thickness not less than about 20 nm. If the thickness is less than about 20 nm, the lattice constant transition may not be sufficient and lattice dislocation may still occur. The epitaxial growth of the buffer layer 210 may include applying a silicon-containing precursor (e.g., $Si_2H_6$, or $Si_3H_8$) under a pressure from about 10 torr to about 100 torr and under a temperature between about 550° C. and about 650° C.

Figure 5:
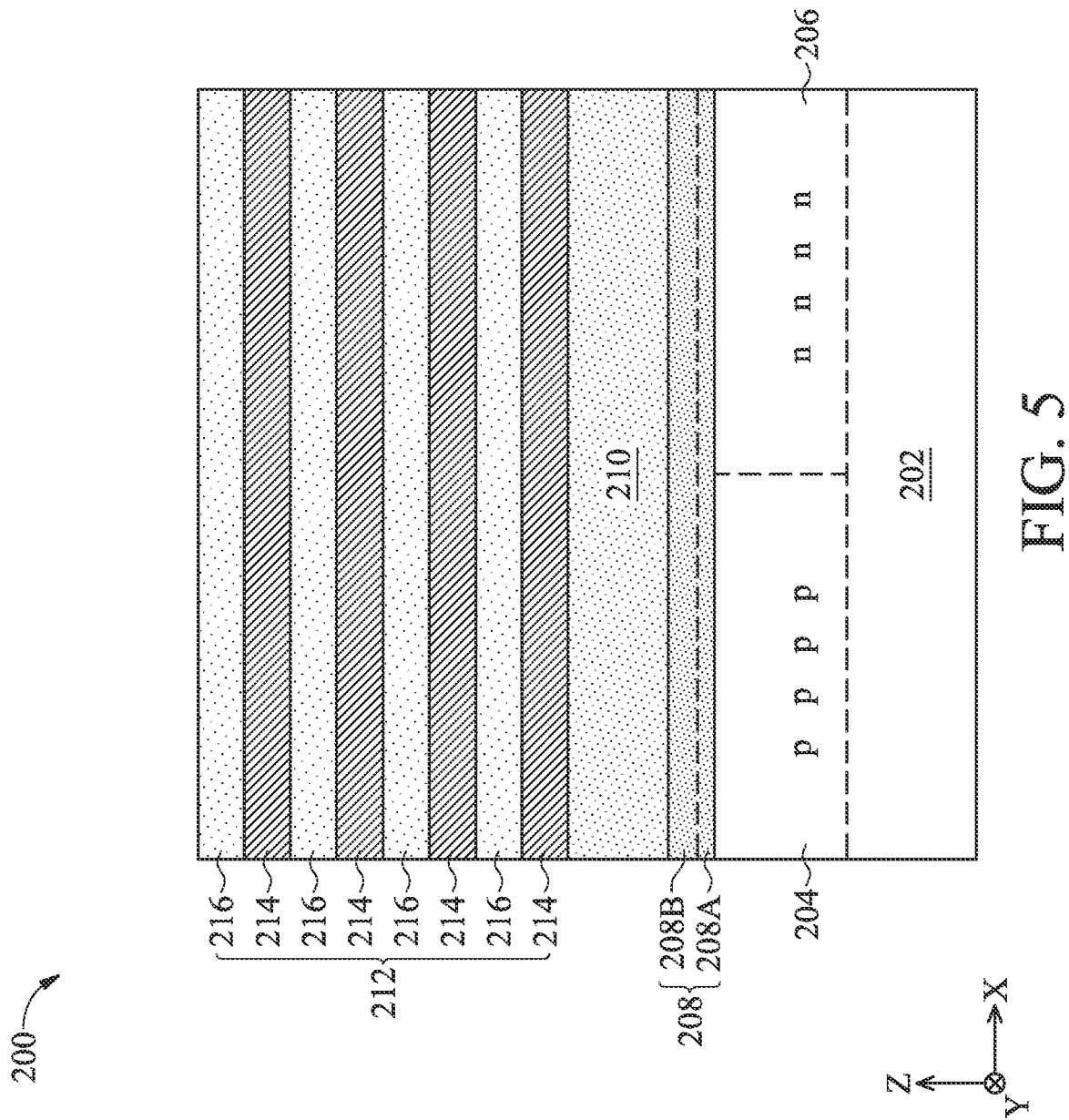

At operation 108, the method 100 (FIG. 1A) forms one or more epitaxial layers over the buffer layer 210, as shown in FIG. 5. In some embodiments, an epitaxial stack 212 is formed over the buffer layer 210. The epitaxial stack 212 includes epitaxial layers 214 of a first composition interposed by epitaxial layers 216 of a second composition. The first and second composition can be different. In an embodiment, the epitaxial layers 214 are SiGe and the epitaxial layers 216 are silicon. However, other embodiments are possible including those that provide for a first composition and a second composition having different oxidation rates and/or etch selectivity. In some embodiments, the epitaxial layer 214 includes SiGe and where the epitaxial layer 216 includes silicon, the silicon oxidation rate is less than the SiGe oxidation rate. It is noted that four (4) layers of each of epitaxial layers 214 and 216 are illustrated in FIG. 5, which is for illustrative purposes only and not intended to be limiting beyond what is specifically recited in the claims. It can be appreciated that any number of epitaxial layers can be formed in the epitaxial stack 212; the number of layers depending on the desired number of channels regions for the device 200. In some embodiments, the number of epitaxial layers 216 is between 2 and 10, such as 4 or 5.

In some embodiments, the epitaxial layer 214 has a thickness ranging from about 4 nm to about 6 nm. The epitaxial layers 214 may be substantially uniform in thickness. In some embodiments, the epitaxial layer 216 has a thickness ranging from about 2 nm to about 3 nm. In some embodiments, the epitaxial layers 216 of the stack are substantially uniform in thickness. As described in more detail below, the epitaxial layer 216 may serve as channel region(s) for a subsequently-formed multi-gate device and its thickness chosen based on device performance considerations. The epitaxial layer 214 may serve to define a gap distance between adjacent channel region(s) for a subsequently-formed multi-gate device and its thickness chosen based on device performance considerations.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the layers 216, include the same material as the substrate 202. In some embodiments, the epitaxially grown layers 214 and 216 include a different material than the substrate 202. As stated above, in at least some examples, the epitaxial layer 214 includes an epitaxially grown $Si_{1-x}Ge_x$ layer (e.g., x is about 25-55%) and the epitaxial layer 216 includes an epitaxially grown silicon (Si) layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation, etch selectivity properties. In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process. In the illustrated embodiment, the bottom layer of the epitaxial stack 212 is a SiGe layer, the buffer layer 210 is an undoped silicon layer, and the blocking layer is a silicon carbide (SiC) layer. Compared with epitaxially growing a SiGe layer directly from a SiC layer where large lattice mismatch exists, the undoped silicon layer has a lattice constant between SiC and SiGe layers which helps mitigate lattice mismatch.

Figure 6:
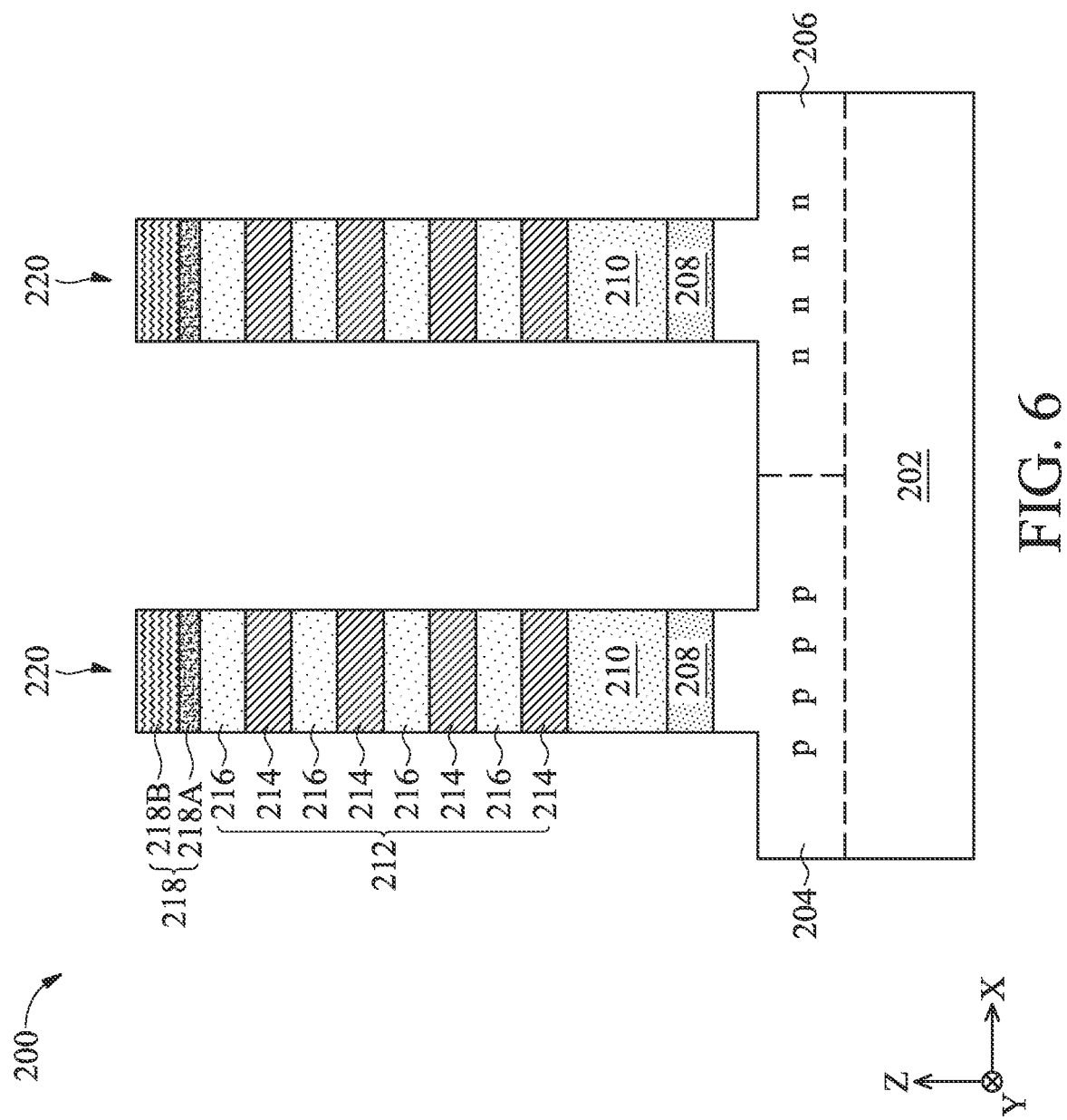

At operation 110, the method 100 (FIG. 1A) patterns the epitaxial stack 212 to form semiconductor fins 220 (also referred to as fins 220), as shown in FIG. 6. In the illustrated embodiment, the buffer layer 210, the blocking layer 208 and a top portion of the substrate 202 are also patterned. In various embodiments, each of the fins 220 includes an upper portion of the interleaved epitaxial layers 214 and 216, a middle portion of patterned buffer layer 210 and blocking layer 208, and a bottom portion protruding from the substrate 202. In some embodiments, operation 106 includes forming a mask layer 218 over the epitaxial stack 212. The mask layer 218 includes a first mask layer 218A and a second mask layer 218B. The first mask layer 218A is a pad oxide layer made of a silicon oxide, which can be formed by a thermal oxidation. The second mask layer 218B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 218 is patterned into a mask pattern by using patterning operations including photolithography and etching.

Operation 106 subsequently patterns the epitaxial stack 212, the buffer layer 210, and the blocking layer 208 in an etching process, such as a dry etch (e.g., reactive ion etching), a wet etch, and/or other suitable process, through openings defined in the patterned mask layer 218. The stacked epitaxial layers 214 and 216 are thereby patterned into fins 220 with trenches between adjacent fins. Each of the fins 220 protrudes upwardly in the z-direction from the substrate 202 and extends lengthwise in the y-direction. In FIG. 3, two (2) fins 220 are spaced apart along the x-direction with one fin disposed above the p-well 204 and one fin disposed above the n-well 206. But the number of the fins is not limited to two, and may be as small as one or more than two.

Figure 7:
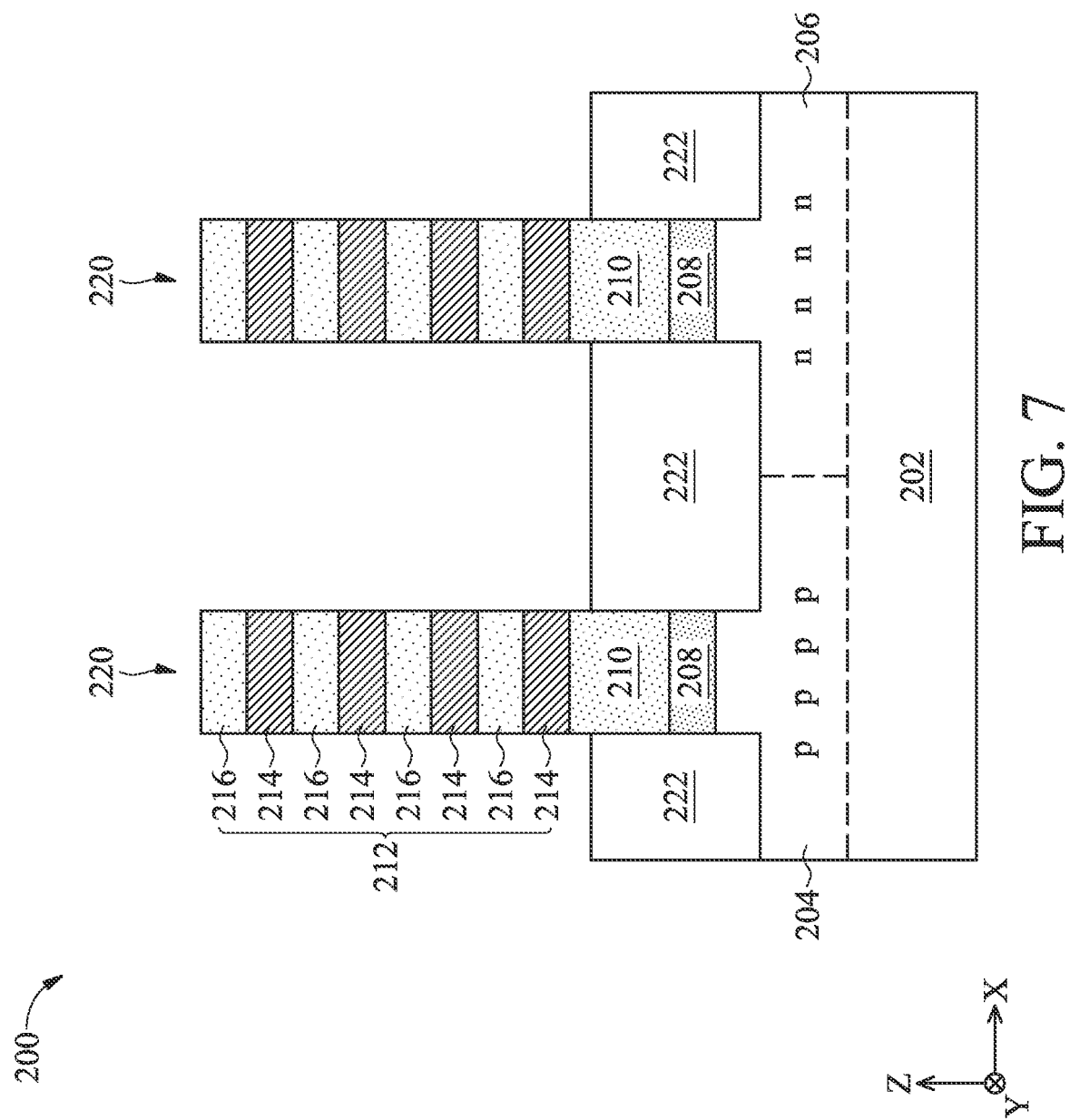
Figure 8:
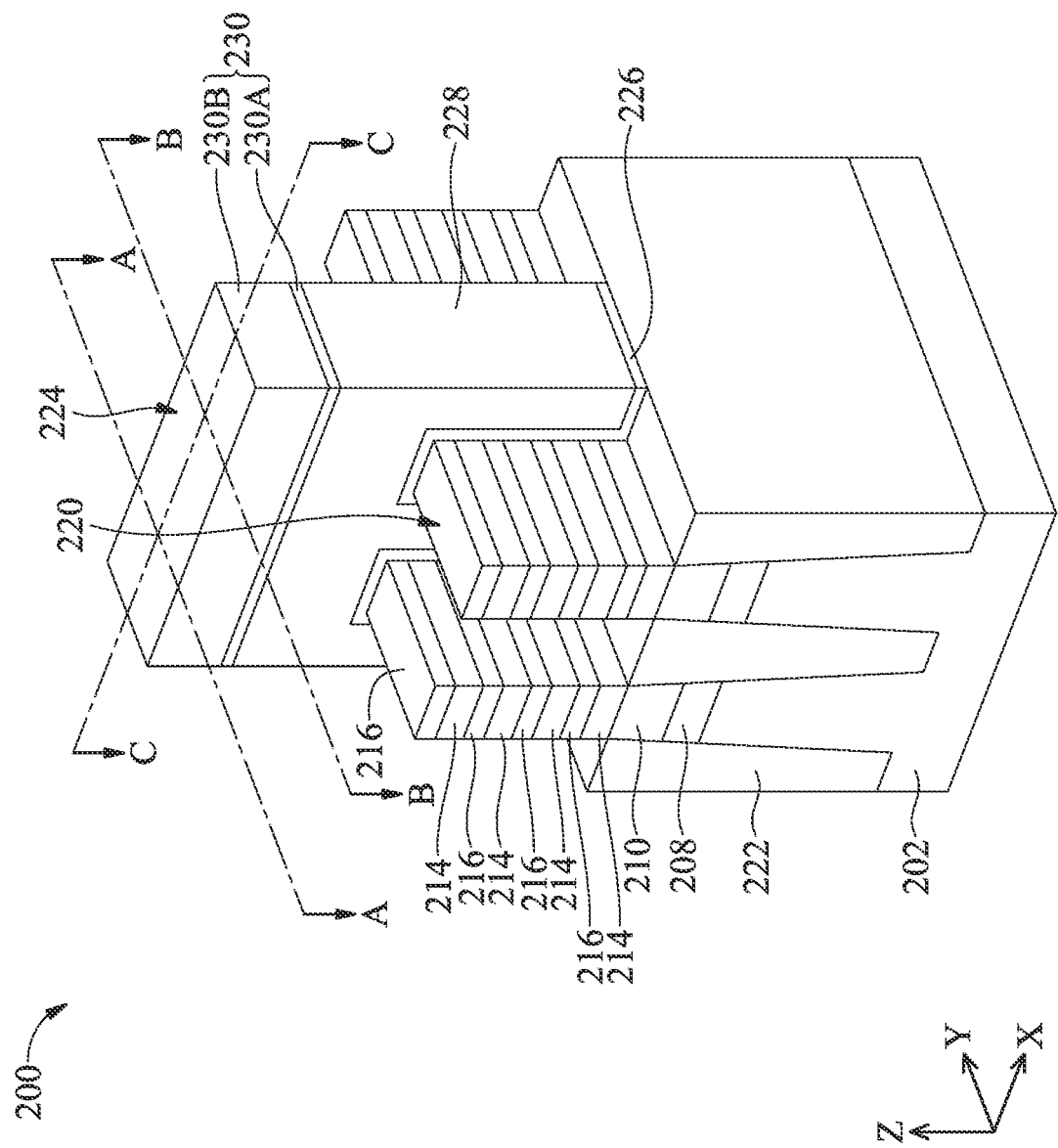
FIG. 8 illustrates a three-dimensional perspective view of an example semiconductor device in accordance with some embodiments of the present disclosure.

At operation 112, the method 100 (FIG. 1A) fills the trenches between adjacent fins 220 with a dielectric material to form an isolation feature 222, as shown in FIG. 7. The isolation feature 222 may include one or more dielectric layers. Suitable dielectric materials for the isolation feature 222 may include silicon oxides, silicon nitrides, silicon carbides, FluoroSilicate Glass (FSG), low-K dielectric materials, and/or other suitable dielectric materials. The dielectric material may be deposited by any suitable technique including thermal growth, CVD, HDP-CVD, PVD, ALD, and/or spin-on techniques. Operation 112 subsequently recesses the isolation features 222 to form shallow trench isolation (STI) features (also denoted as STI features 222). In the illustrated embodiment, the STI features 222 are disposed on sidewalls of the blocking layer 208 and buffer layer 210. A top surface of the STI feature 222 may be coplanar with a top surface of the buffer layer 210, or lower than the top surface of the buffer layer 210 (as illustrated in FIG. 7) for about 1 nm to about 10 nm. Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220. The mask layer 218 (FIG. 6) may also be removed before, during, and/or after the recessing of the isolation features 222. In some embodiments, the mask layer 218 is removed by a CMP process performed prior to the recessing of the isolation features 222. In some embodiments, the mask layer 218 is removed by an etchant used to recess the isolation features 222.

At operation 114, the method 100 (FIG. 1A) forms a sacrificial (dummy) gate structure 224, as shown in FIG. 8. The sacrificial gate structure 224 is formed over a portion of the fins 220 which is to be channel regions. The sacrificial gate structure 224 defines the channel region of the GAA device. The sacrificial gate structure 224 includes a sacrificial gate dielectric layer 226 and a sacrificial gate electrode layer 228. The sacrificial gate structure 224 is formed by first blanket depositing the sacrificial gate dielectric layer 226 over the fins 220. A sacrificial gate electrode layer 228 is then blanket deposited on the sacrificial gate dielectric layer 226 and over the fins 220. The sacrificial gate electrode layer 228 includes silicon such as polycrystalline silicon or amorphous silicon. The thickness of the sacrificial gate dielectric layer is in a range from about 1 nm to about 5 nm in some embodiments. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer 226 and the sacrificial gate electrode layer 228 are deposited using CVD, including LPCVD and PECVD, PVD, ALD, or other suitable process. Subsequently, a mask layer 230 is formed over the sacrificial gate electrode layer. The mask layer 230 may include a pad silicon oxide layer 230A and a silicon nitride mask layer 230B. Subsequently, a patterning operation is performed on the mask layer 230 and sacrificial gate dielectric and electrode layers are patterned into the sacrificial gate structure 224. By patterning the sacrificial gate structure 224, the fins 220 are partially exposed on opposite sides of the sacrificial gate structure 224, thereby defining source/drain (S/D) regions. In this disclosure, a source and a drain are interchangeably used and the structures thereof are substantially the same.

Figure 9:
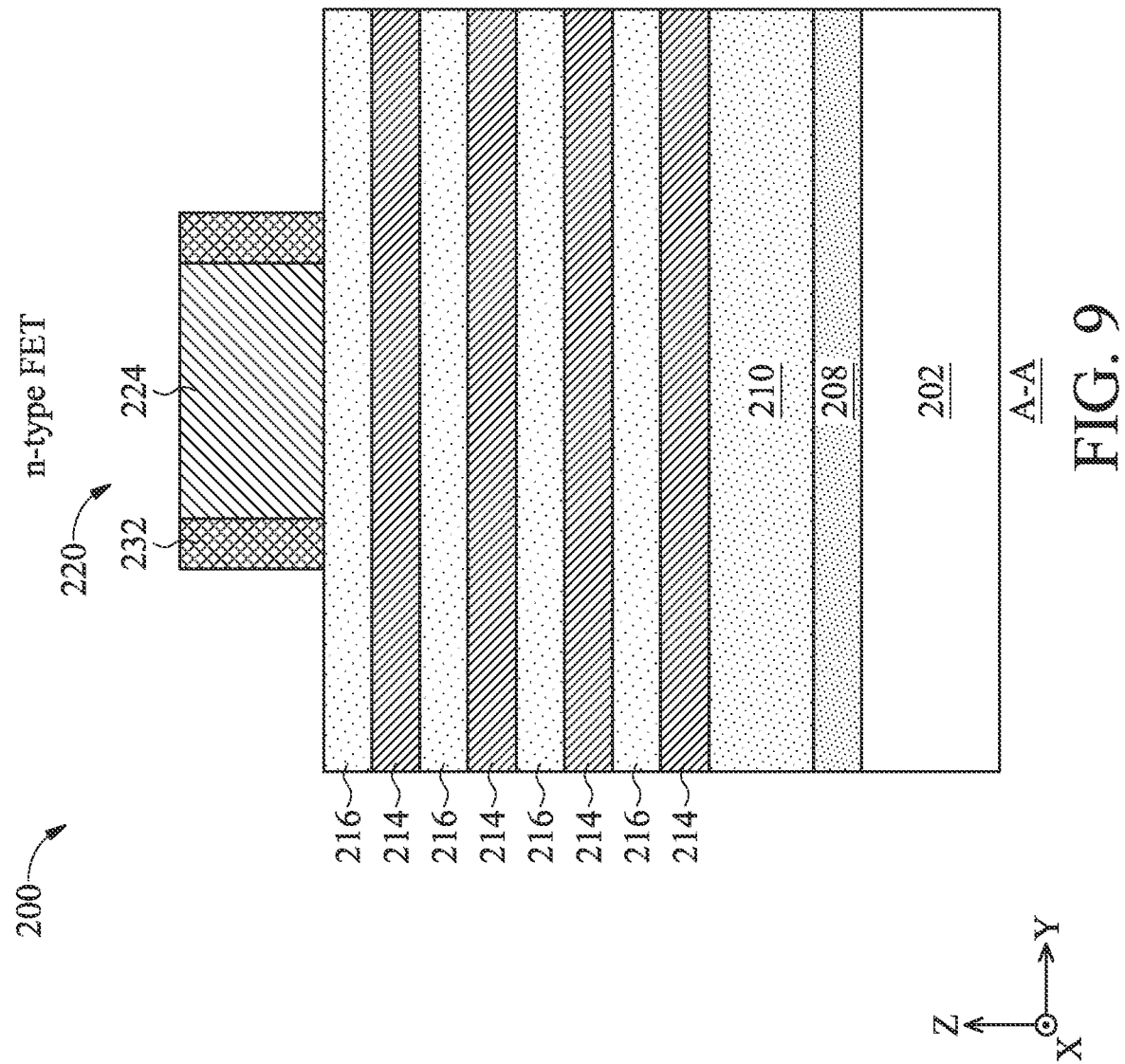

At operation 116, the method 100 (FIG. 1A) forms gate sidewall spacers 232 on sidewalls of the sacrificial gate structure 224, as shown in FIG. 9 which is a cross-sectional view along A-A line of the device 200 in FIG. 8. The gate sidewall spacers 232 also cover a portion of the top surfaces of the fin 220 (along A-A line the fin above p-well is shown). The gate sidewall spacers 232 may include a dielectric material such as silicon oxide, silicon nitride, silicon carbide, silicon oxynitride, SiCN films, silicon oxycarbide, SiOCN films, and/or combinations thereof. In some embodiments, the gate sidewall spacers 232 include multiple layers, such as main spacer walls, liner layers, and the like. By way of example, the gate sidewall spacers 232 may be formed by depositing a dielectric material layer over the sacrificial gate structure 224 using processes such as, CVD process, a subatmospheric CVD (SACVD) process, a flowable CVD process, an ALD process, a PVD process, or other suitable process. In some embodiments, the deposition of the dielectric material layer is followed by an etching-back (e.g., anisotropically) process to expose portions of the fin 220 adjacent to and not covered by the sacrificial gate structure 224 (e.g., S/D regions). The dielectric material layer may remain on the sidewalls of the sacrificial gate structure 224 as gate sidewall spacers 232. In some embodiments, the etching-back process may include a wet etch process, a dry etch process, a multiple-step etch process, and/or a combination thereof. The gate sidewall spacers 232 may have a thickness ranging from about 5 nm to about 20 nm.

Figure 10:
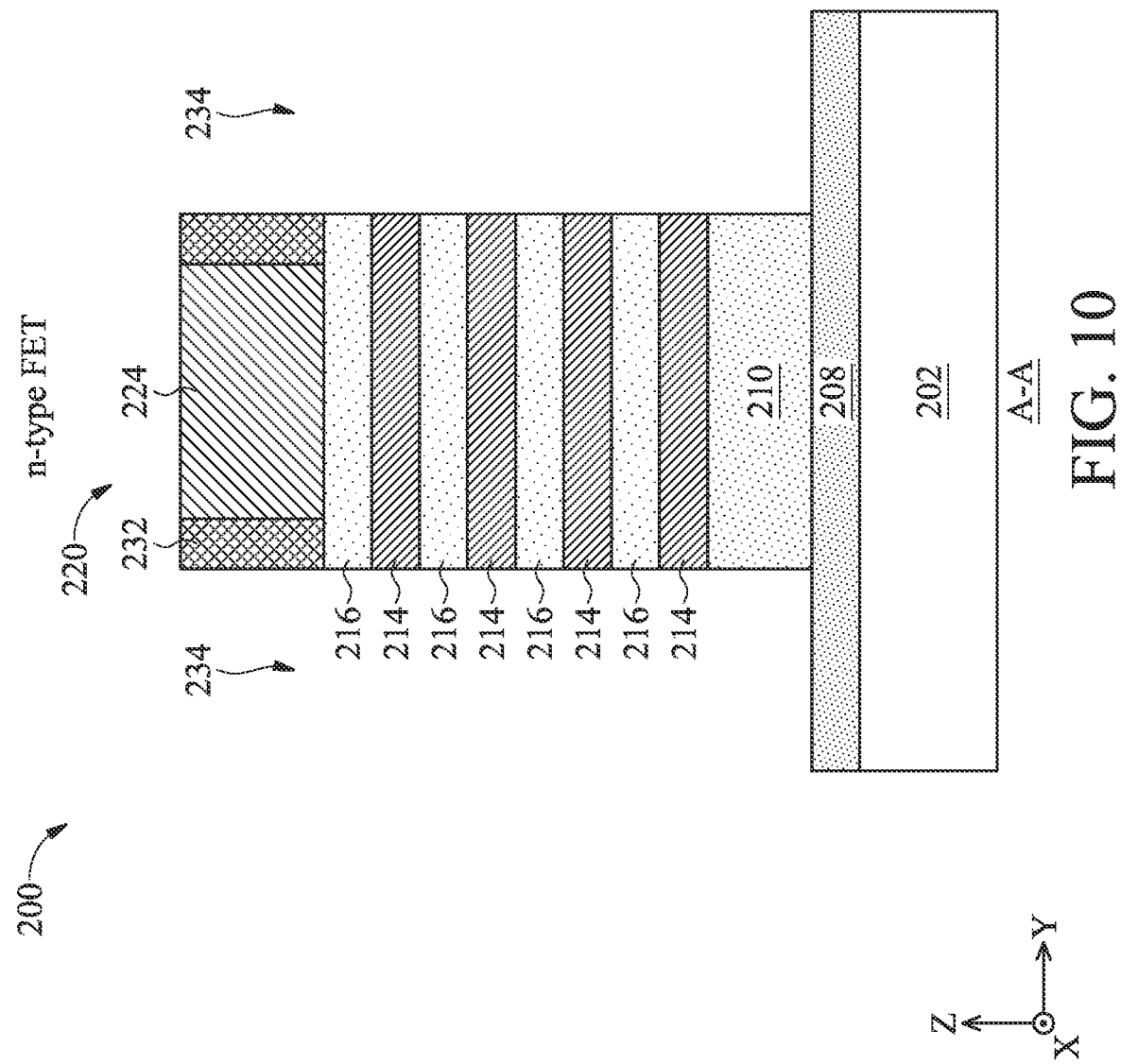

At operation 118, the method 100 (FIG. 1A) recesses a portion of the fin 220 to form recesses 234 in the S/D regions, as shown in FIG. 10 which is a cross-sectional view along A-A line of the device 200 in FIG. 8. The stacked epitaxial layers 214 and 216 are etched down at the S/D regions. In the illustrated embodiment, the buffer layer 210 is also etched. The blocking layer 208 acts as an etch stop layer to prevent the substrate 202 from being etched. In many embodiments, operation 118 forms the recesses 234 by a suitable etching process, such as a dry etching process, a wet etching process, or an RIE process. The etching process at operation 118 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof.

Figure 11:
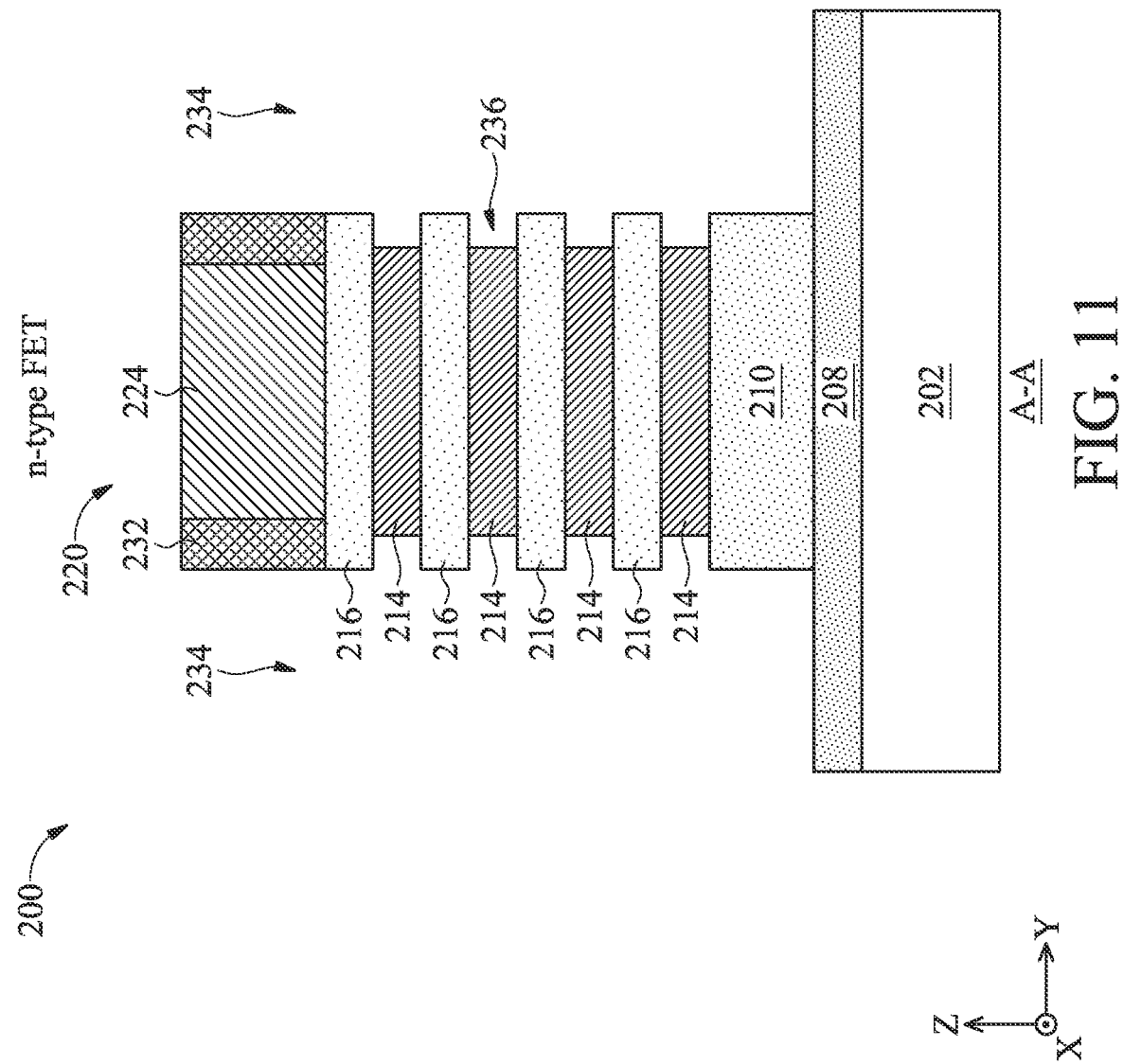

At operation 120, the method 100 (FIG. 1B) forms inner spacers directly under the gate sidewall spacers 232. In some embodiments, operation 120 first laterally etches the epitaxial layers 214 in the y-direction, thereby forming cavities 236, as shown in FIG. 11 which is a cross-sectional view along A-A line of the device 200 in FIG. 8. The amount of etching of the epitaxial layers 214 is in a range from about 1 nm to about 4 nm in some embodiments. The epitaxial layers 214 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. Alternatively, operation 120 may first selectively oxidize lateral ends of the epitaxial layers 214 that are exposed in the recesses 234 to increase the etch selectivity between the epitaxial layers 214 and 216. In some examples, the oxidation process may be performed by exposing the device 200 to a wet oxidation process, a dry oxidation process, or a combination thereof.

Figure 12:
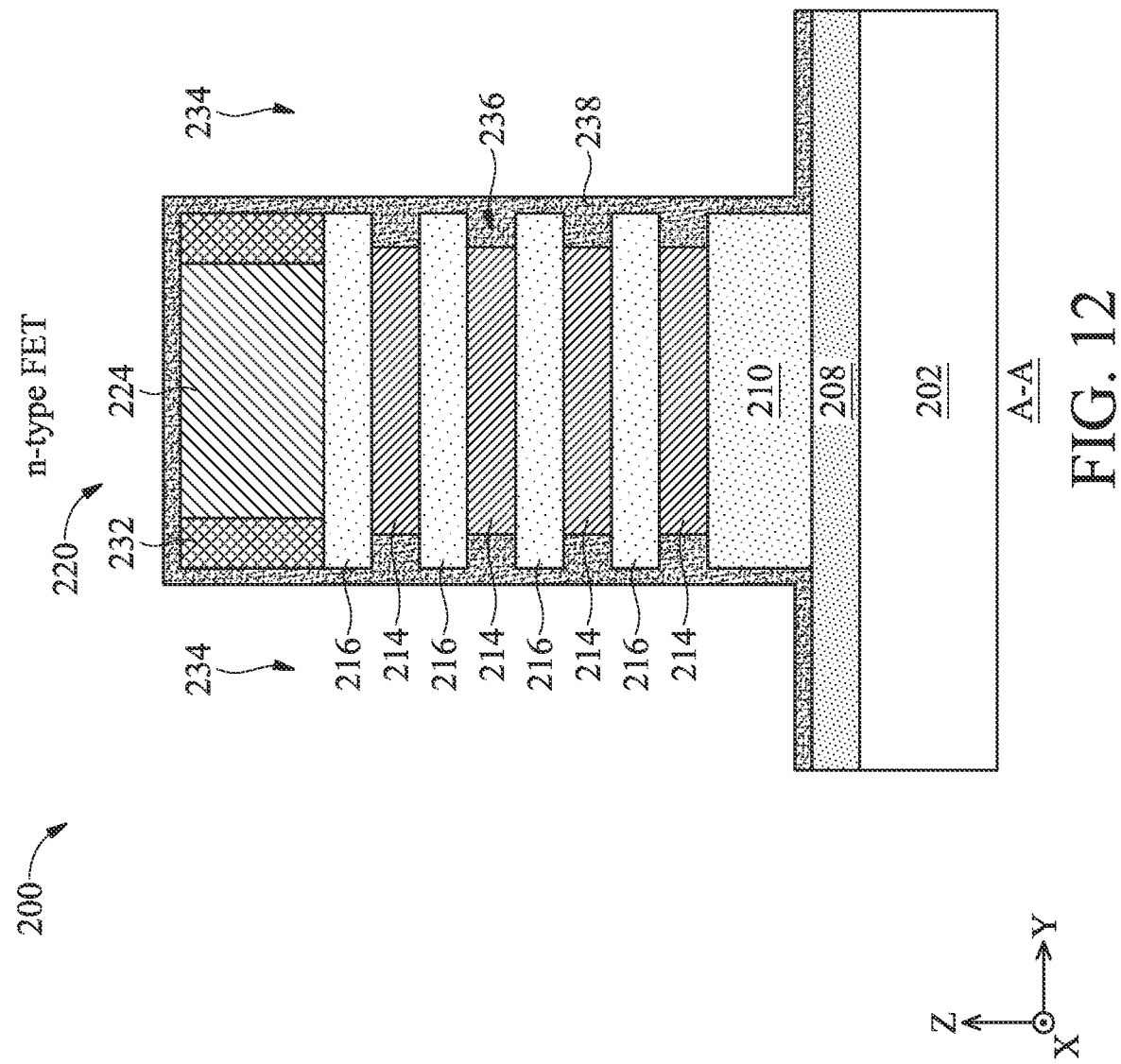

Subsequently, operation 120 forms an inner spacer material layer 238 on the lateral ends of the epitaxial layer 214 and on the epitaxial layers 216 in the recesses 234 and cavities 236, as shown in FIG. 12 which is a cross-sectional view along A-A line of the device 200 in FIG. 8. The inner spacer material layer 238 may include silicon oxides, silicon nitrides, silicon carbides, silicon carbide nitride, silicon oxide carbide, silicon carbide oxynitride, and/or other suitable dielectric materials. In some embodiments, the inner spacer material layer 238 is deposited as a conformal layer. The inner spacer material layer 238 can be formed by ALD or any other suitable method. By conformally forming the inner spacer material layer 238, the size of cavity 236 is reduced or completely filled.

Figure 13:
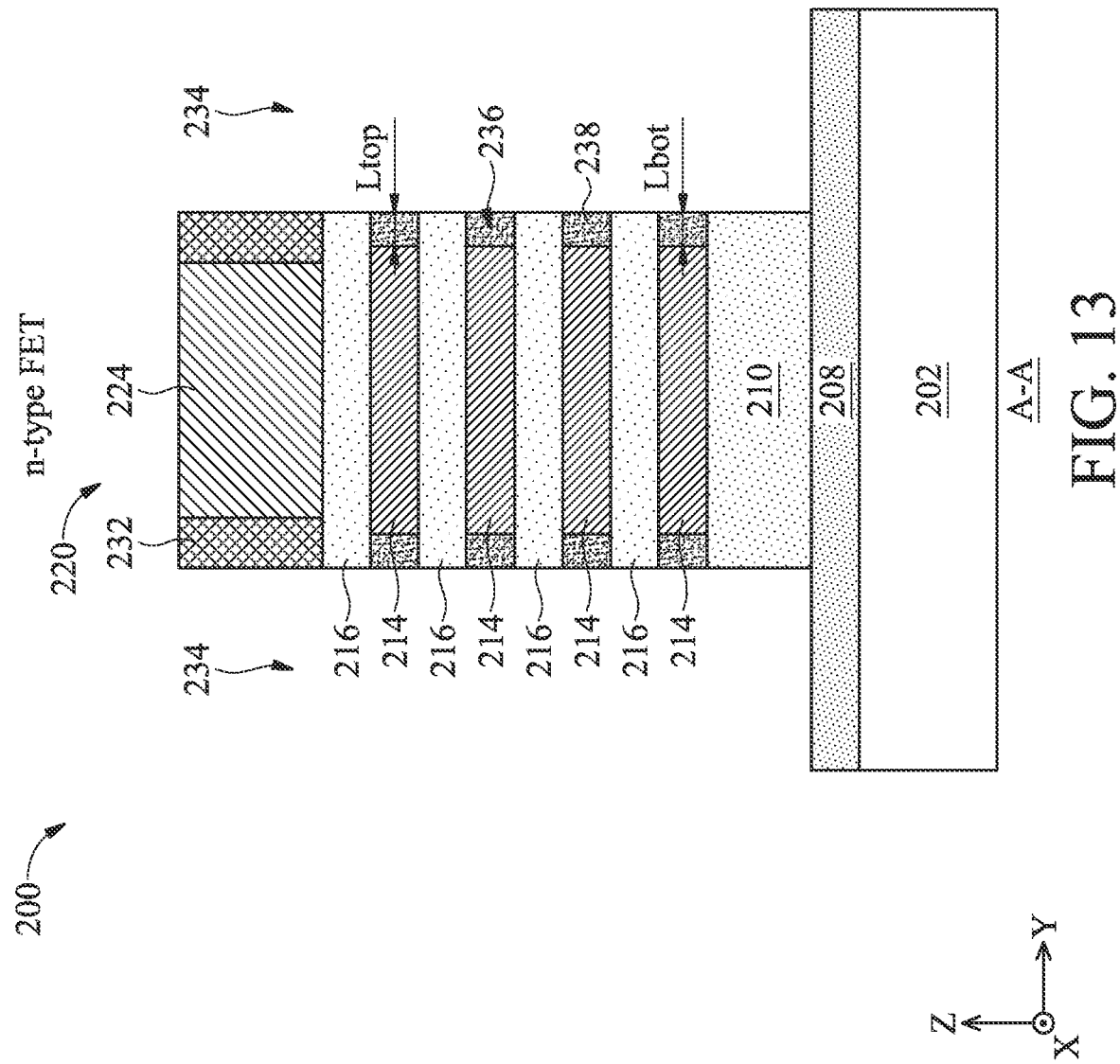

After the inner spacer material layer 238 is formed, an etching operation is performed to partially remove the inner spacer material layer 238, as shown in FIG. 13 which is a cross-sectional view along A-A line of the device 200 in FIG. 8. By this etching, the inner spacer material layer 238 remains substantially within the cavity 236, because of a small volume of the cavity. Generally, plasma dray etching etches a layer in wide and flat areas faster than a layer in concave (e.g., holes, grooves and/or slits) portions. Thus, the inner spacer material layer 238 can remain inside the cavities 236. The remained portions of the inner spacer material layer 238 is denoted as the inner spacers 238. If there is no the blocking layer 208 to block dopants in the substrate 202 to diffuse upwardly into different layers of the epitaxial layers 214 and 216, lower layers of the epitaxial layers 214 will have a higher dopant concentration and thus higher etch rate than upper layers of the epitaxial layers 214. Accordingly, after lateral etching the cavities 236, as well as the inner spacers 238 that fill the cavities 236, at lower layers will have larger lengths than those at upper layers. Conventionally, without the blocking layer 208, a length $L_{bot}$ of the bottommost inner spacer 238 may be at least 30% larger than a length $L_{top}$ of the topmost inner spacer 238. As a comparison, with the blocking layer 208 to block dopant diffusion from the substrate underneath, in various embodiments, inner spacers 238 at different layers have substantially the same length. In some embodiments, a length $L_{bot}$ of the bottom most inner spacer 238 is slightly larger than a length $L_{top}$ of the top most inner spacer 238, but a ratio of $L_{bot}$ over $L_{top}$ is confined within about 1.05:1 to about 1.2:1.

At operation 122, the method 100 (FIG. 1B) forms epitaxial S/D features 240 in recesses 234. In some embodiments, the epitaxial S/D features 240 include silicon for an n-type FET and SiGe for a p-type FET. In the embodiments where the blocking layer 208 includes SiC, since lattice mismatch between SiGe and SiC is larger than lattice mismatch between Si and SiC, for p-type FET an etching process may first be performed to open the blocking layer 208 from the bottom of the recess 234. A top portion of the substrate 202 exposed in the recess 234 may also be etched. Accordingly, SiGe can epitaxially grow from silicon instead of from SiC to reduce lattice dislocation. While for n-type FET, it may be acceptable for Si to directly epitaxially grow form SiC without an etching process to expose the substrate 202, since lattice mismatch between Si and SiC is not as big as between SiGe and SiC. The resulting device 200 after the etching process is shown in FIGS. 14A and 14B, where FIG. 14A shows a cross-sectional view of an n-type FET and FIG. 14B shows a cross-sectional view of a p-type FET.

Subsequently, the epitaxial S/D features 240 are formed by an epitaxial growth method using CVD, ALD or molecular beam epitaxy (MBE). The epitaxial S/D features 240 are formed in contact with the epitaxial layers 216, and separated from the epitaxial layers 214 by the inner spacers 238, as shown in FIGS. 15A and 15B, where FIG. 15A shows a cross-sectional view of an n-type FET and FIG. 15B shows a cross-sectional view of a p-type FET. In some embodiment, cavities 236 are not filled by the inner spacer material 238 but be capped by the epitaxial S/D features 240. Therefore, cavities 236 is also referred to as "air spacer". In the illustrated embodiment, the epitaxial S/D feature 240 of the n-type FET is above the blocking layer 208, while a bottom surface of the epitaxial S/D feature 240 of the p-type FET is below the blocking layer 208 and a bottom surface of the epitaxial S/D feature 240 of the n-type FET.

At operation 124, the method 100 (FIG. 1B) forms a contact etch stop layer (CESL) 242 over the epitaxial S/D features 240 and an interlayer dielectric (ILD) layer 244 over the CESL layer 242, as shown in FIGS. 16A and 16B, where FIG. 16A shows a cross-sectional view of an n-type FET and FIG. 16B shows a cross-sectional view of a p-type FET. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetra-ethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. In some embodiments, forming the ILD layer 244 further includes performing a CMP process to planarize a top surface of the device 200, such that the top surfaces of the sacrificial gate structure 224 are exposed.

Figure 17A:
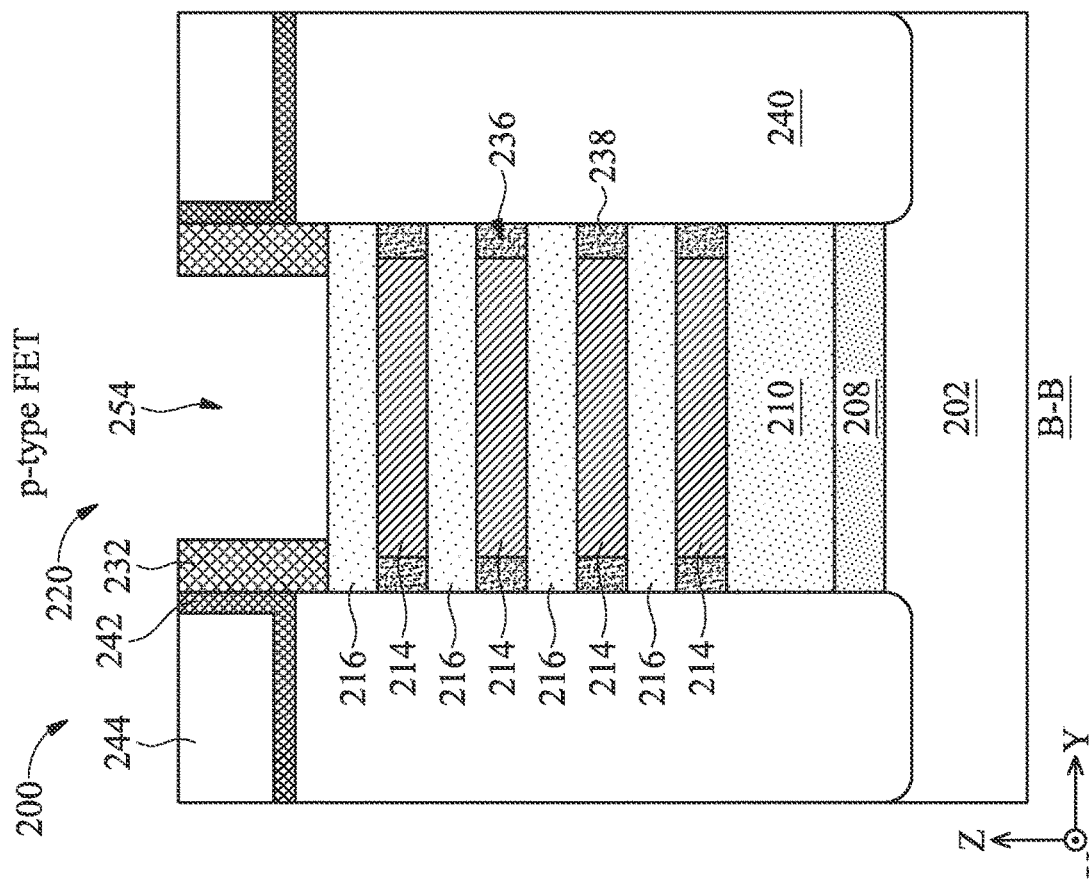
Figure 17B:
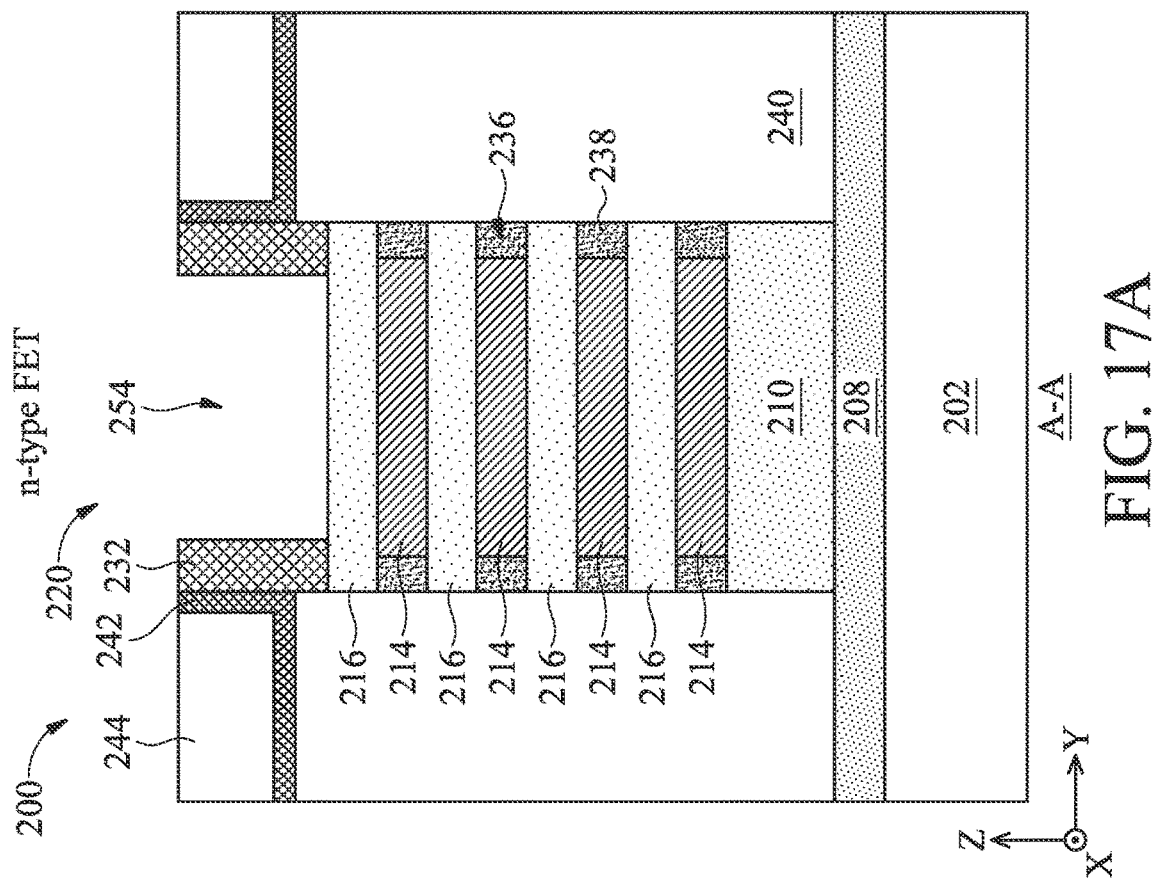

At operation 126, the method 100 (FIG. 1B) removes the sacrificial gate structure 224 to form a gate trench 254, as shown in FIGS. 17A and 17B, where FIG. 17A shows a cross-sectional view of an n-type FET and FIG. 17B shows a cross-sectional view of a p-type FET. The gate trench 254 exposes the fin 220 in the channel region. The ILD layer 244 and the CESL layer 242 protects the epitaxial S/D features 240 during the removal of the sacrificial gate structure 224. The sacrificial gate structure 224 can be removed using plasma dry etching and/or wet etching. When the sacrificial gate electrode layer is polysilicon and the ILD layer 244 is silicon oxide, a wet etchant such as a TMAH solution can be used to selectively remove the sacrificial gate electrode layer. The sacrificial gate dielectric layer is thereafter removed using plasma dry etching and/or wet etching.

At operation 128, the method 100 (FIG. 1B) releases channel members from the channel region of the GAA device, as shown in FIGS. 18A and 18B, where FIG. 18A shows a cross-sectional view of an n-type FET and FIG. 18B shows a cross-sectional view of a p-type FET. In the illustrated embodiment, channel members are epitaxial layers 216 in the form of nanosheets. In the present embodiment, the epitaxial layers 216 include silicon, and the epitaxial layers 214 include silicon germanium. The plurality of epitaxial layers 214 may be selectively removed. In some implementations, the selectively removal process includes oxidizing the plurality of epitaxial layers 214 using a suitable oxidizer, such as ozone. Thereafter, the oxidized epitaxial layers 214 may be selectively removed from the gate trench 254. To further this embodiment, the operation 128 includes a dry etching process to selectively remove the epitaxial layers 214, for example, by applying an HCl gas at a temperature of about 500° C. to about 700° C., or applying a gas mixture of $CF_4$, $SF_6$, and $CHF_3$. For the sake of simplicity and clarity, after operation 130, the epitaxial layers 216 are denoted as nanosheets 216. At this point, as shown in FIGS. 18A and 18B, vertically stacked nanosheets 216 are formed in the channel regions of the n-type GAA device and p-type GAA device.

Figure 19A:
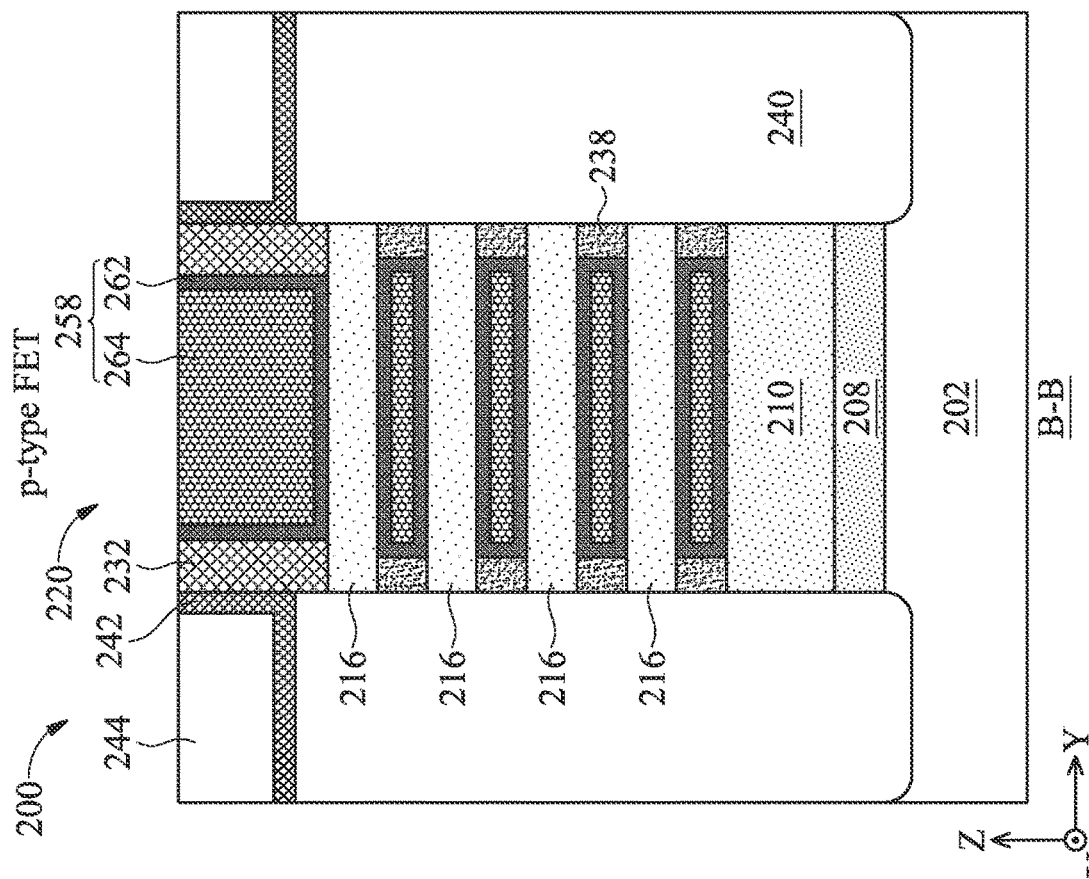
Figure 19B:
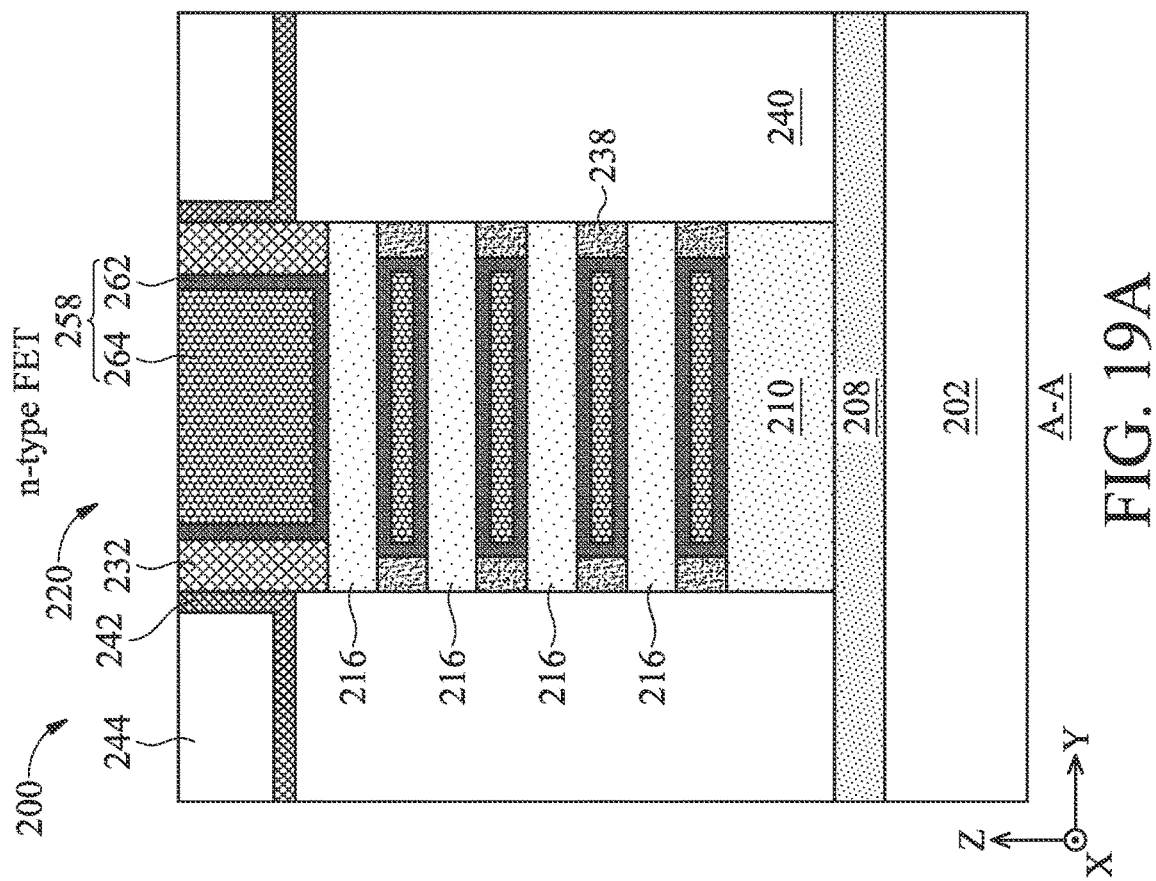

At operation 130, the method 100 (FIG. 1B) forms metal gate structure 258 in the gate trench 254 engaging the nanosheets 216 in the channel region, as shown in FIGS. 19A and 19D where FIG. 19A shows a cross-sectional view of an n-type FET and FIG. 19D shows a cross-sectional view of a p-type FET. A gate dielectric layer 262 is formed wrapping each nanosheet 216 in the channel region, and a gate electrode layer 264 is formed on the gate dielectric layer 262. The inner spacers 238 separate the metal gate structure 258 from contacting the epitaxial S/D features 240.

In some embodiments, the gate dielectric layer 262 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 262 includes an interfacial layer (not shown) formed between the channel layers and the dielectric material. The gate dielectric layer 262 may be formed by CVD, ALD or any suitable method. In one embodiment, the gate dielectric layer 262 is formed using a highly conformal deposition process such as ALD in order to ensure the formation of a gate dielectric layer having a uniform thickness around each channel layers. The thickness of the gate dielectric layer 262 is in a range from about 1 nm to about 6 nm in some embodiments.

The gate electrode layer 264 is formed on the gate dielectric layer 262 to surround each channel layer. The gate electrode layer 264 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 264 may be formed by CVD, ALD, electro-plating, or other suitable method. The gate dielectric layer 262 and the gate electrode layer 264 may also be deposited over the upper surface of the ILD layer 250. The gate dielectric layer 262 and the gate electrode layer 264 formed over the ILD layer 250 are then planarized by using, for example, CMP, until the top surface of the ILD layer 250 is revealed. In some embodiments, after the planarization operation, the gate electrode layer 264 is recessed and a cap insulating layer (not shown) is formed over the recessed gate electrode layer 264. The cap insulating layer includes one or more layers of a silicon nitride-based material, such as SiN. The cap insulating layer can be formed by depositing an insulating material followed by a planarization operation.

FIG. 20 shows a cross-sectional view along the C-C line of the device 200 in FIG. 8 after operation 130. In the illustrated embodiment, n-type FET and p-type FET shares the same metal gate structure. FIG. 21 shows an alternative embodiment of the device 200 in a cross-sectional view along the C-C line, where n-type FET and p-type FET have separate metal structures. In certain embodiments of the present disclosure, one or more work function adjustment layers (not shown) are interposed between the gate dielectric layer 262 and the gate electrode layer 264. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Although not intended to be limiting, one or more embodiments of the present disclosure provide many benefits to a semiconductor device and the formation thereof. The present disclosure provides methods of forming a GAA device above a blocking layer. The blocking layer provides anti-punch-through (APT) function but also blocks dopant diffusions from the substrate underneath. Accordingly, this provides a benefit of less lattice dislocation during forming of semiconductor fins and better uniformity of inner spacer dimensions. Furthermore, the GAA flow with blocking layer formation method can be easily integrated into existing semiconductor fabrication processes.

In one exemplary aspect, the present disclosure is directed to a method. The method includes providing a semiconductor substrate; epitaxially growing a blocking layer from a top surface of the semiconductor substrate, wherein the blocking layer has a lattice constant different from the semiconductor substrate; epitaxially growing a semiconductor layer above the blocking layer; patterning the semiconductor layer to form a semiconductor fin, wherein the blocking layer is under the semiconductor fin; forming a source/drain (S/D) feature in contact with the semiconductor fin; and forming a gate structure engaging the semiconductor fin. In some embodiments, the lattice constant of the blocking layer is smaller than that of the semiconductor substrate. In some embodiments, a lower portion of the blocking layer is a polycrystalline layer and an upper portion of the blocking layer is a crystalline layer. In some embodiments, the forming of the blocking layer includes applying a hydrogen and a carbon-containing precursor at a first temperature followed by applying the carbon-containing precursor and a silicon-containing precursor at a second temperature that is higher than the first temperature. In some embodiments, the carbon-containing precursor includes ethylene and the silicon-containing precursor includes trichlorosilane. In some embodiments, the blocking layer includes a material selected from the group of SiP, SiAs, SiCP, and SiC. In some embodiments, the method further includes epitaxially growing a buffer layer between the blocking layer and the semiconductor layer, wherein the buffer layer has a lattice constant larger than the lattice constant of the blocking layer. In some embodiments, the buffer layer has a thickness larger than the blocking layer. In some embodiments, the forming of the S/D feature includes: recessing a portion of the semiconductor fin, thereby exposing the blocking layer; removing a portion of the blocking layer, thereby exposing the semiconductor substrate; and epitaxially growing the S/D feature from the semiconductor substrate. In some embodiments, the method further includes forming a spacer feature interposing between the S/D feature and the gate structure, wherein a bottommost portion of the spacer feature has a first length measured along a lengthwise direction of the semiconductor fin, wherein a topmost portion of the spacer feature has a second length measured along the lengthwise direction of the semiconductor fin, and wherein a ratio of the first length over the second length ranges from about 1.05:1 to about 1.2:1.

In another exemplary aspect, the present disclosure is directed to a method of manufacturing a multi-gate device. The method includes providing a semiconductor substrate; forming a blocking layer in contact with the semiconductor substrate, wherein the blocking layer has a higher resistance than the semiconductor substrate; forming a buffer layer in contact with the blocking layer, wherein the buffer layer has a lower resistance than the blocking layer; forming a plurality of semiconductor nanosheets above the buffer layer; forming an epitaxial source/drain (S/D) feature in contact with the plurality of semiconductor nanosheets; and forming a gate structure wrapping each of the plurality of semiconductor nanosheets. In some embodiments, the blocking layer has a higher thermal conductivity and a lower coefficient of thermal expansion than the semiconductor substrate and the buffer layer. In some embodiments, the buffer layer and the plurality of semiconductor nanosheets include a same material composition. In some embodiments, the blocking layer has a thickness ranging from about 2 nm to about 5 nm. In some embodiments, a thickness of the buffer layer is not less than about 20 nm. In some embodiments, the epitaxial S/D feature is directly above the blocking layer.

In another exemplary aspect, the present disclosure is directed to a semiconductor device. The semiconductor device includes a semiconductor substrate; a blocking layer disposed over the semiconductor substrate; a buffer layer disposed over the blocking layer; a plurality of semiconductor nanosheets disposed over the buffer layer; a source/drain (S/D) feature abutting the plurality of semiconductor nanosheets; a gate stack wrapping each of the plurality of semiconductor nanosheets; and inner spacers interposing between the S/D feature and the gate stack. In some embodiments, the semiconductor device further includes an isolation feature disposed on sidewalls of the buffer layer and the blocking layer. In some embodiments, a top surface of the isolation feature is lower than a top surface of the buffer layer. In some embodiments, the plurality of semiconductor nanosheets extends lengthwise in a first direction, wherein a bottommost inner spacer has a first length measured along the first direction and a topmost inner spacer has a second length measured along the first direction, and wherein a ratio of the first length over the second length ranges from about 1.05:1 to about 1.2:1.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor device, comprising:
a semiconductor substrate having a first lattice constant;

a dopant blocking layer disposed over the semiconductor substrate, wherein the dopant blocking layer has a second lattice constant different from the first lattice constant;
a buffer layer disposed over the dopant blocking layer, wherein the buffer layer has a third lattice constant different from the second lattice constant;
a plurality of channel members suspended over the buffer layer, wherein a top surface of the buffer layer is vertically spaced apart from a bottommost one of the plurality of channel members;
an epitaxial feature abutting the plurality of channel members, wherein a bottom portion of the epitaxial feature is below the top surface of the buffer layer; and
a gate structure wrapping each of the plurality of channel members.

2. The semiconductor device of claim 1, wherein the second lattice constant is smaller than the first lattice constant, and the third lattice constant is larger than the second lattice constant.

3. The semiconductor device of claim 2, wherein the first lattice constant substantially equals the third lattice constant.

4. The semiconductor device of claim 1, wherein the dopant blocking layer includes a material selected from a group of Si P, SiAs, SiCP, and SiC.

5. The semiconductor device of claim 4, wherein the buffer layer is an undoped silicon layer.

6. The semiconductor device of claim 1, wherein a lower portion of the dopant blocking layer is a polycrystalline layer and an upper portion of the dopant blocking layer is a crystalline layer.

7. The semiconductor device of claim 1, further comprising:
an isolation feature disposed on sidewalls of the buffer layer and the dopant blocking layer.

8. The semiconductor device of claim 7, wherein a top surface of the isolation feature is lower than a top surface of the buffer layer.

9. The semiconductor device of claim 1, wherein the dopant blocking layer separates the epitaxial feature from contacting the semiconductor substrate.

10. The semiconductor device of claim 1, wherein the epitaxial feature is in contact with the buffer layer, the dopant blocking layer, and the semiconductor substrate.

11. A semiconductor device, comprising:
a semiconductor substrate;
a first semiconductor layer in contact with the semiconductor substrate, wherein the first semiconductor layer has a higher resistance than the semiconductor substrate, and wherein the first semiconductor layer includes a compound of silicon and at least an element other than silicon;
a second semiconductor layer in contact with the first semiconductor layer, wherein the second semiconductor layer has a lower resistance than the first semiconductor layer;
a plurality of semiconductor nanosheets suspended over the second semiconductor layer;
an epitaxial feature in contact with the plurality of semiconductor nanosheets; and
a gate structure wrapping each of the plurality of semiconductor nanosheets.

12. The semiconductor device of claim 11, wherein the second semiconductor layer and the plurality of semiconductor nanosheets include a same material composition.

13. The semiconductor device of claim 11, wherein the semiconductor substrate is doped with a dopant, and the first and second semiconductor layers are both substantially free of the dopant.

14. The semiconductor device of claim 11, wherein the second semiconductor layer has a thickness not less than about 20 nm and the first semiconductor layer has a thickness ranging from about 2 nm to about 5 nm.

15. The semiconductor device of claim 11, further comprising:
inner spacers interposing the epitaxial feature and the gate structure,
wherein the plurality of semiconductor nanosheets extends lengthwise in a first direction, wherein a bottommost inner spacer has a first length measured along the first direction and a topmost inner spacer has a second length measured along the first direction, and wherein a ratio of the first length over the second length ranges from about 1.05:1 to about 1.2:1.

16. The semiconductor device of claim 11, wherein the epitaxial feature is directly above the first semiconductor layer.

17. A semiconductor device, comprising:
a substrate including a first region and a second region, wherein the substrate in the first region is doped with a first dopant, the substrate in the second region is doped with a second dopant, and the first and second dopants are of opposite types;
a dopant blocking layer in the first and second regions;
a first plurality of channel members suspended above the dopant blocking layer in the first region;
a second plurality of channel members suspended above the dopant blocking layer in the second region;
a first epitaxial layer abutting the first plurality of channel members, wherein the first epitaxial layer extends from the substrate and through an opening of the dopant blocking layer in the first region; and
a second epitaxial layer abutting the second plurality of channel members, wherein the second epitaxial layer is separated from the substrate by the dopant blocking layer in the second region.

18. The semiconductor device of claim 17, wherein the first region is a p-type transistor region and the second region is an n-type transistor region.

19. The semiconductor device of claim 17, wherein the first dopant is an n-type dopant and the second dopant is a p-type dopant.

20. The semiconductor device of claim 17, wherein the dopant blocking layer includes a material composition selected from a group of SiP, SiAs, SiCP, and SiC.

* * * * *